(12) United States Patent
Ishigaki et al.

(10) Patent No.: US 6,236,117 B1
(45) Date of Patent: *May 22, 2001

(54) SEMICONDUCTOR MEMORY DEVICE INCLUDING SHUNT INTERCONNECTION

(75) Inventors: Yoshiyuki Ishigaki; Hiroki Honda, both of Hyogo (JP)

(73) Assignee: Mitsubishi Denki Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/048,066

(22) Filed: Mar. 26, 1998

(30) Foreign Application Priority Data

Oct. 6, 1997 (JP) .................................................. 9-272834

(51) Int. Cl.[7] .............................. H01L 27/11; H01L 23/48
(52) U.S. Cl. ......................... 257/903; 257/904; 257/758
(58) Field of Search .................................... 257/734, 754, 257/758, 773, 776, 390, 391, 258, 291, 443, 909, 911, 903, 904, 66, 67, 69, 379, 380, 381; 365/69, 154, 180, 185.07

(56) References Cited

U.S. PATENT DOCUMENTS

| 5,122,857 | 6/1992 | Ikeda et al. ............................ 257/377 |
| 5,610,856 | 3/1997 | Yoshizumi et al. ................... 365/154 |

*Primary Examiner*—Steven Loke
*Assistant Examiner*—Hung Kim Vu
(74) *Attorney, Agent, or Firm*—McDermott, Will & Emery

(57) ABSTRACT

A semiconductor device including a shunt interconnection which operates at higher speed and permits high density integration is provided. In the semiconductor device including the shunt interconnection, a shunt connection region for a word line and a first shunt interconnection including a metal are formed in the memory cell region. In the memory cell region, shunt connection region and shunt interconnection are electrically connected with each other through a word line contact plug formed in a contact hole.

9 Claims, 28 Drawing Sheets

SEMICONDUCTOR MEMORY DEVICE INCLUDING SHUNT INTERCONNECTION

BACKGROUND OF THE INVENTION

1. Field of the Invention

The present invention relates generally to semiconductor devices, and more particularly, to a semiconductor device including a shunt interconnection.

2. Description of the Background Art

SRAMs (Static Random Access Memories) have been known as one kind of volatile semiconductor devices. In the SRAM, memory cells are provided at crossing portions of complementary data lines (bit lines) and word lines arranged in a matrix. FIG. 30 is an equivalent circuit diagram of a memory cell portion in a conventional SRAM. Referring to FIG. 30, the memory cell in the conventional SRAM is formed of two access transistors A1 and A2, two driver transistors D1 and D2, and two high resistance load elements R1 and R2.

The two high resistance load elements R1 and R2 and the two driver transistors D1 and D2 form a flip-flop circuit. In the flip-flop circuit, two cross-coupled storage nodes N1 and N2 are formed. The flipflop circuit has two stable states, High (N1) and Low (N2), and Low (N1) and High (N2). One of the two states continues to be held as long as a prescribed power supply voltage is supplied.

One of the source/drain regions of access transistor A1 is connected with a bit line BIT. The other one of the source/drain regions of access transistor A1 is connected with the storage node N1 of the flip-flop circuit. One of the source/drain regions of access transistor A2 is connected with a complementary bit line $\overline{\text{BIT}}$. The other one of the source/drain regions of access transistor A2 is connected with the storage node N2 of the flip-flop circuit. The gate electrodes of access transistors A1 and A2 are connected to a word line WL. Word line WL controls the on/off states of access transistors A1 and A2.

The drain regions of driver transistors D1 and D2 are connected with the other ones of the source/drain regions of access transistors A1 and A2, respectively, and the source regions of driver transistors D1 and D2 are connected to a ground line. The gate electrode of driver transistor D1 is connected with the other one of the source/drain regions of access transistor A2, and the gate electrode of driver transistor D2 is connected with the other one of the source/drain regions of access transistor A1. One ends of high resistance load elements R1 and R2 are connected with the other ones of the source/drain regions of access transistors A1 and A2, respectively. The other ends of high resistance load elements R1 and R2 are connected with a power supply line.

During a data writing operation, access transistors A1 and A2 are turned on by selecting word line WL. A voltage is forcibly applied on bit line pair BIT and $\overline{\text{BIT}}$ depending upon a prescribed logical value, the flip-flop circuit is set to one of the above-described states. During a data reading operation, access transistors A1 and A2 are turned on. The potentials at storage nodes N1 and N2 are transmitted to the bit line pair.

In such an SRAM, there has been a need for operating the device at a higher speed and with a lower voltage in recent years. In order to increase the operation speed, a reduction in the electrical resistance of a word line is an inevitable requirement. In order to operate the device with a lower voltage, the potential of the ground line must be stabilized at the ground level, which requires a reduction in the electrical resistance of the ground line as well.

It has been conventionally practiced for this purpose to form a word line and a ground line of polysilicon or polycide, and to form a main interconnection or a shunt interconnection of a metal film on the word line or ground line with an interlayer insulating film interposed therebetween. There is provided a connection region for a main interconnection or shunt interconnection each for 8 bits or 16 bits of memory cells, and the word line and ground line are electrically connected with the main interconnection or shunt interconnection in the connection region.

FIG. 31 is a diagram showing a memory cell in a conventional SRAM including a word line and a main word line.

Referring to FIG. 31, memory array 101 in the conventional SRAM includes a plurality of word decoder portions 102a and 102b, and memory mat portions 103a and 103b. In memory mat portion 103a, word lines 106a, 106b, 106c, and 106d are formed to extend from word decoder portion 102a at prescribed intervals. Complementary bit lines 105a and 105b are formed orthogonal to word lines 106a, 106b, 106c and 106d. Memory cells 104a and 104b are formed at crossing points of a word line and bit lines. A single main word line 107 corresponding to four word lines 106a, 106b, 106c and 106d is formed to electrically connect these word lines at word decoder portion 102a. Main word line 107 is formed of a metal such as aluminum Thus, the single main word line 107 is electrically connected with word lines 106a, 106b, 106c and 106d at word decoder portion 102a, an electrical signal to word lines 106a, 106b, 106c and 106d may be transmitted through main word line 107. Main word line 107 is formed of a metal having a low electrical resistance, and therefore the electrical signal transmitted to word lines 106a, 106b, 106c and 106d is passed through main word line 107, transmission delay to word lines 106a, 106b, 106c and 106d may be reduced.

FIG. 32 is a layout of a memory cell in another conventional SRAM including a shunt interconnection.

Referring to FIG. 32, the memory cell in the conventional SRAM includes access transistors 108a and 108b, and driver transistors 110a and S10b. A word line 106 is formed on a semiconductor substrate so as to serve as the gate electrodes of access transistors 108a and 108b. Complementary bit lines 105a and 105b are formed on word line 106 with a first interlayer insulating film interposed therebetween. A shunt interconnection 107 of a metal film is formed on complementary bit lines 105a and 105b with a second interlayer insulating film interposed therebetween. Word line 106 and shunt interconnection 107 are electrically connected in a contact hole 109 formed in a region different from the memory cell region.

Thus, in the conventional SRAM, in order to increase the operation speed, the main word line or shunt word line is formed and electrically connected with a word line in a region other than a memory cell region such as the word decoder portion.

When a shunt interconnection of a metal film is formed, and a ground line and the shunt interconnection are connected in the connection region for shunt in order to reduce the electrical resistance of the ground line, the connection region is also formed in a region other than the memory cell region as is the case with the word line.

There has been an increasing need for high density integration of SRAMs in addition to the above need for increasing the operation speed and reducing the operation voltage. However, as shown in FIGS. 31 and 32, the connection region for connecting the main word line or shunt interconnection 107 with word line 106 should be secured separately from the memory cell region, which gives rise to difficulty in increasing the integration density of the SRAMs. This similarly applies to the case of forming the shunt interconnection for the ground line.

SUMMARY OF THE INVENTION

It is an object of the invention to provide a semiconductor device capable of operating at a higher speed and permitting high density integration.

Another object of the invention is to provide a semiconductor device capable of operating with a lower voltage and permitting high density integration.

A semiconductor device according to one aspect of the invention includes a plurality of memory cells arranged in a matrix. A word line is formed on a first memory cell of the plurality of memory cells. A first low resistance shunt interconnection is formed on the word line with a first interlayer insulating film interposed therebetween. The first shunt interconnection is one of a plurality of shunt interconnections, at least one of which is formed for each of the plurality of memory cells provided adjacent to each other in the direction almost orthogonal to the direction in which the word line extends. The word line and the first shunt interconnection are electrically connected in a first connection region for shunt. The first connection region is formed in a region two-dimensionally overlapping the first memory cell. According to this aspect of the invention, the low resistance first shunt interconnection is electrically connected with the word line in the first connection region for shunt, a signal may be transmitted through the first shunt interconnection to the word line, and the word line may be reduced in resistance. Furthermore, the first connection region for shunt is formed in the region two-dimensionally overlapping in the memory cell, there is no need to secure another area for the first connection region other than the memory cell region. A highly integrated semiconductor device may be provided as compared to the case of providing the first connection region in a region other than the memory cell. In addition, since at least one first shunt interconnection is formed for each of the plurality of memory cells provided adjacent to each other in the direction almost orthogonal to the direction in which the word line extends, the number of shunt interconnections per word line can be increased as compared to the conventional case, and the resistance of the word lines can be reduced as compared to the conventional case.

In the semiconductor device according to this aspect, a ground line may be formed on the first memory cell or a second memory cell. A second low resistance shunt interconnection may be formed on the word line and the ground line with a second interlayer insulating film interposed therebetween. The second shunt interconnection may be one of a plurality of shunt interconnections each formed for at least two of the plurality of memory cells provided adjacent to each other in the direction almost orthogonal to the direction in which the word line extends. The ground line and the second shunt interconnection may be electrically connected in a second connection region for shunt. The second connection region may be formed in a region two-dimensionally overlapping said first memory cell. Thus, the ground line is electrically connected with the second shunt interconnection in the second connection region, and therefore current passed to the ground line may be passed to the second low resistance shunt interconnection, which results in a reduction in the resistance of the ground line in addition to the reduction in the resistance of the word line. As a result, the device may be operated at a higher speed because of the reduction in the resistance of the word line, and at the same time the device may be operated with a lower voltage because of the stabilization of the potential of the ground line at the ground level. Furthermore, the second connection region as well as the first connection region are formed in the regions two-dimensionally overlapping the memory cell, and therefore it is not necessary to secure a region for providing the first and second connection regions other than in the memory cell region. Thus, a highly integrated semiconductor device may be provided as compared to the case of providing the first and second connection regions in a region other than the memory cell region.

In the semiconductor device according to this aspect, the first shunt interconnection may include at least one of a metal layer and a refractory metal silicide layer having a low electrical resistance. Thus, the first shunt interconnection may be reduced in resistance. As a result, the word line may be effectively reduced in resistance.

In the semiconductor device according to this aspect, a power supply line may be formed in the region at a position between the word line and the first shunt interconnection. The power supply line may be provided so as not to two-dimensionally overlap the first connection region. As a result, the first connection region may be formed in the region overlapping the memory cell region in such a structure having the power supply line between the word line and a first shunt interconnection. Therefore, there is no necessity to secure another region for forming the first connection region other than the memory cell region. As a result, in a semiconductor device having a power supply line positioned between a word line and a first shunt interconnection, a highly integrated semiconductor device may be provided as compared to the case of providing the first connection region in a region other than the memory cell region.

In the semiconductor device according to this aspect, the ground line may be formed in a region positioned between the word line and the first shunt interconnection, and the ground line may be formed so as not to two-dimensionally overlap the first connection region. Thus, if the ground line is present between the word line and the first shunt interconnection, the first connection region may be formed in a region overlapping the memory cell. There is no necessity to secure another region for the first connection region other than the memory cell region. As a result, in such a semiconductor device having a ground line positioned between a word line and a first shunt interconnection, a highly integrated semiconductor device may be formed as compared to the case of providing the first connection region in a region other than the memory cell.

In the semiconductor device according to this aspect, at least one such first connection region may be formed for at least four memory cells provided adjacent to each other in the direction in which the word line extends. Thus, the word line may be reduced in resistance and the area occupied by the first interconnection region on the memory cell may be reduced. Thus, in increasing the integration density of a semiconductor device, limitations associated with layout of other elements or interconnections on the memory cell may be reduced.

A semiconductor device according to another aspect of the invention includes a plurality of memory cells arranged in a matrix. A first ground line is formed on a first memory cell of the plurality of memory cells. A first low resistance shunt interconnection is formed on the first ground line with a first interlayer insulating film interposed therebetween. The first shunt interconnection may be one of a plurality of shunt interconnections each formed for at least two of the plurality of memory cells provided adjacent to each other in a direction almost orthogonal to the direction in which the ground line extends. The first ground line and the first shunt interconnection are electrically connected with each other in a first connection region for shunt. The first connection region is formed in a region two-dimensionally overlapping the first memory cell. In the semiconductor device according to this aspect, since the first low resistance shunt interconnection is electrically connected with the first ground line in the first connection region for shunt, current passed to the first ground line may be passed to the first low resistance shunt interconnection. Thus, the ground line may be reduced in resistance. As a result, the potential of the ground line can be stabilized at the ground level, and the semiconductor device may be operated with a lower voltage.

Furthermore, since the first connection region is formed in a region two-dimensionally overlapping the first memory cell, there is no necessity to secure another region for the first connection region other than the memory cell region. Thus, the semiconductor device may be highly integrated as compared to the case of providing the first connection region in a region other than the memory cell.

In the semiconductor device according to this aspect, a second memory cell may be provided adjacent to said first memory cell in a direction almost orthogonal to the direction in which the first ground line extends, and a second ground line may be formed to extend almost in parallel to the first ground line on the second memory cell. The first and second ground lines may be electrically connected with each other. Thus, the second ground line having no region directly in connection with the first low resistance shunt interconnection may be electrically connected with the first shunt interconnection via the first ground line. Thus, the second ground line may be reduced in resistance without providing a shunt interconnection or a connection region for shunt on the second memory cell. As a result, the semiconductor device may be operated with a lower voltage.

In the semiconductor device according to this aspect, the first shunt interconnection may include at least one of a metal layer and a refractory metal silicide layer having allow electrical resistance. Thus, the first shunt interconnection may be reduced in resistance. As a result, the ground line may be reduced in resistance.

In the semiconductor device according to this aspect, at least one such first connection region may be formed for at least two memory cells formed adjacent to each other in the direction in which the ground line extends. Thus, the ground line may be reduced in resistance, while the area occupied by the first connection region on the memory cells may be reduced. As a result, in highly integrating a semiconductor device, limitations associated with layout of other elements or interconnections on the memory cell may be reduced.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
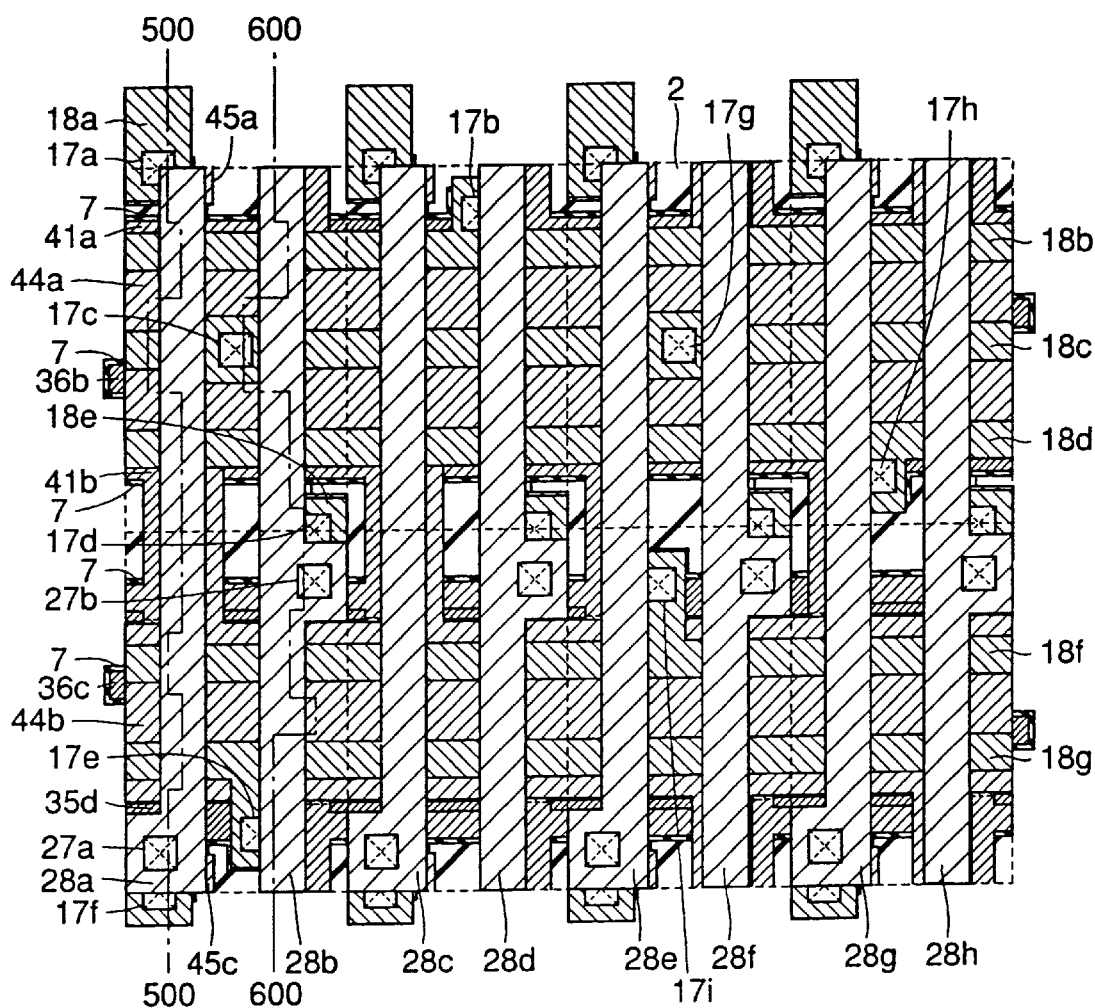
FIG. 1 is a two-dimensional layout showing memory cells arranged in a matrix of two rows×four columns in an SRAM according to a first embodiment of the invention.

Preferred embodiments of the invention will be now described in conjunction with the accompanying drawings.
First Embodiment Referring to FIGS. 1 to 3, the structure of a memory cell portion in an SRAM according to a first embodiment of the invention will be described. Note that lines 500—500 and 600—600 in FIG. 1 are bent at a plurality of points in order to simultaneously indicate essential elements in the SRAM in FIGS. 2 and 3.

Figure 3:
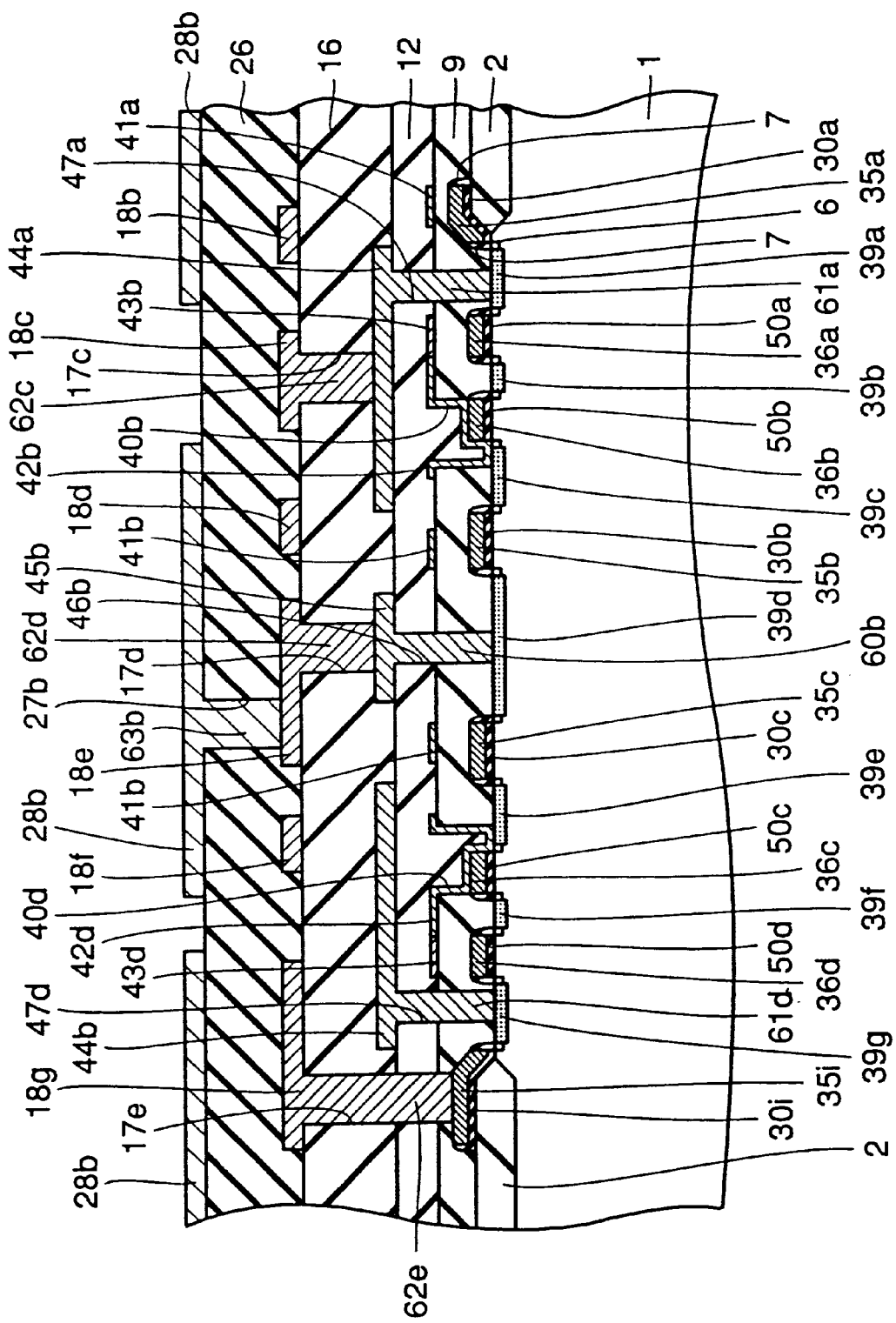
FIG. 3 is a cross sectional view taken along line 600—600 in FIG. 1.

In the memory cell according to the first embodiment, a $p^-$ type well region (not shown) is formed on a surface of an $n^-$ type silicon substrate 1. As shown in FIG. 3, a field insulating film 2 for element isolation is formed in a prescribed region of the surface of $p^-$ type well region. In an active region surrounded by field insulating film 2, $n^+$ type source/drain regions 39a to 39g are formed at prescribed intervals. On the channel sides of $n^+$ type source/drain regions 39a to 39g, $n^-$ type source/drain regions 6 are formed. $N^-$ type source/drain region 6, and each of $n^+$ type source/drain regions 39a to 39g form a source/drain region in an LDD (Lightly Doped Drain) structure.

There are formed on prescribed channel regions positioned between source/drain regions 39a to 39g and on prescribed regions of field insulating films 2, word lines 35a, 35b, 35c and 35d (see FIG. 2) and a region 35i for shunt connection for word line 35d with gate insulating films 30a, 30b, 30c, 30d (see FIG. 2) and 30i. There are formed, on prescribed channel regions positioned between $n^+$ type source/drain regions 39a to 39g, the gate electrodes 36a to 36d of driver transistors with gate insulating films 50a to 50d interposed therebetween. Sidewall oxide films 7 are formed on sides of word lines 35a to 35d and gate electrodes 36a to 36d. An interlayer insulating film 9 of a silicon oxide film is formed to cover the entire surface. Contact holes 40b and 40d are formed in prescribed regions of interlayer insulating film 9.

Low resistance plugs 42b and 42d of polysilicon are formed in contact holes 40b and 40d, which constitute storage node portions. On interlayer insulating film 9, Vcc interconnections 41a and 41b, and high resistance portions 43b and 43d are formed. An interlayer insulating film 12 is formed to cover the entire surface of interlayer insulating film 9. On prescribed regions of interlayer insulating films 12 and 9, ground line contact holes 47a and 47d, and a contact hole 46b for bit line connection are formed.

Ground lines 44a and 44b are formed on prescribed regions on interlayer insulating film 12. Ground line contact plugs 61a and 61d are formed in ground line contact holes 47a and 47d. A bit line contact pad 45b is formed in a prescribed region on interlayer insulating film 12. A bit line contact plug 60b is formed in bit line connection contact hole 46b. An interlayer insulating film 16 is formed to cover the entire surface.

A ground line shunt contact hole 17c and a bit line contact hole 17d are formed in prescribed regions of interlayer insulating film 16. Word line contact hole 17e is formed in prescribed regions of interlayer insulating films 16, 12 and 9. Shunt word lines 18b, 18d, 18f and 18g of a metal layer such as aluminum are formed in prescribed region on interlayer insulating film 16. A word line contact plug 62e is formed in contact hole 17e. Shunt word line 18g is electrically connected with region 35i for shunt connection for word line 35d (see FIG. 2) through word line contact plug 62e formed in contact hole 17e. Now, referring to FIG. 1, contact holes 17b, 17h, 17i and 17e for example in shunt word lines 18b, 18d, 18f and 18g are each formed per four adjacent memory cells formed in the direction in which shunt word line 18b extends.

Referring to FIG. 3, a shunt ground line 18c is formed in a prescribed region on interlayer insulating film 16. A ground line contact plug 62c is formed in contact hole 17c. Shunt ground line 18c is also formed of a metal layer such as aluminum. Shunt word lines 18b, 18d, 18f and 18g and shunt ground line 18c may be formed of refractory metal silicide such as tungsten silicide. Referring to FIG. 1, contact holes 17c and 17g in shunt ground line 18c are each formed for two memory cells formed adjacent to each other in the direction in which shunt ground line 18c extends.

Referring to FIG. 3, a bit line contact pad 18e formed of a metal layer such as aluminum is formed in a prescribed region on interlayer insulating film 16. A bit line contact plug 62d is formed in contact hole 17d. An interlayer insulating film 26 is formed to cover the entire surface. A contact hole 27b is formed in a prescribed region of interlayer insulating film 26. A bit line 28b of a metal layer such as aluminum is formed in a prescribed region on interlayer insulating film 26. A bit line contact plug 63b is formed in contact hole 27b.

Thus, shunt word line 18g of a metal layer such as aluminum is electrically connected with shunt connection region 35i for word line 35d (see FIG. 2) through word line contact plug 62e formed in contact hole 17e, and therefore a signal may be transmitted through shunt word line 18g to word line 35d. As a result, the word line may be reduced in resistance, and the semiconductor memory device may operate at a higher speed.

Furthermore, since shunt ground line 18c of a metal layer is electrically connected with ground line 44a through ground line contact plug 62c, current passed to ground line 44a may be passed to shunt ground line 18c having a low electrical resistance. As a result, ground line 44a may be reduced in resistance. The potential of ground line 44a is thus stabilized at the ground level, which permits the semiconductor device to operate with a lower voltage. Referring to FIG. 1, two of shunt word lines 18b, 18d, 18f and 18g are formed each for a plurality of memory cells provided adjacent to each other in a direction almost orthogonal to word lines, the direction in which bit lines 28a to 28h extend, the number of shunt word lines per word line may be increased as compared to the conventional case. As a result, word lines 35a, 35b, 35c and 35d (see FIG. 2) may be reduced in resistance as compared to the conventional case.

Furthermore, contact hole 17e for shunt word line 18g and contact hole 17c for shunt ground line 18c are formed in a region two-dimensionally overlapping the memory cells. Stated differently, contact hole 17e and contact hole 17c are formed in the memory cell regions when viewed from the top of a plan view thereof (FIG. 1). Therefore, it is not necessary to secure another area for connecting shunt word line 18g with region 35i for shunt connection for word line 35d, and for connecting shunt ground line 18c and ground line 44a other than the memory cells. Thus, the semiconductor device may be highly integrated as compared to the case of providing the shunt connection region in an area other than the memory cells.

Vcc interconnections 41a and 41b serving as power supply lines are provided so as not to two-dimensionally overlap contact hole 17e for shunt word line 18g, and therefore a shunt connection region for connecting shunt word line 18g and region 35i for shunt connection for word line 35d may be formed in a region two-dimensionally overlapping the memory cell region, even if there are Vcc interconnections 41a and 41b between word line 35d and shunt word line 18g.

Since ground lines 44a and 44b are provided so as not to two-dimensionally overlap contact hole 17e serving as the shunt connection region (see FIG. 2) for word line 35d, the shunt connection region for the word line may be formed in a region overlapping the memory cell if there are ground lines 44a and 44b between word line 35d and shunt word line 18g.

Referring to FIG. 1, since contact hole 17e (see FIG. 3) serving as a shunt connection region for connecting shunt word line 18g and region 35i (see FIG. 3) for shunt connection for word line 35d is formed for four memory cells formed adjacent to each other in a direction almost orthogonal to the direction in which bit line 28b extends, the resistance of word line 35d may be reduced, while the number of contact holes 17e serving as the shunt connection region on the memory cell may be reduced, resulting in a reduction in the occupied area. This is also true to contact holes 17b and 17h (see FIG. 1) in other shunt word lines 18b and 18d. Therefore, in highly integrating a semiconductor device, limitations in layout of other interconnections such as other ground lines 44a and 44b on the memory cell may be reduced.

Contact holes 17c and 17g (see FIG. 1) serving as a shunt connection region for shunt ground line 18c and ground lines 44a and 44b are each formed for two memory cells formed adjacent to each other in the direction in which shunt ground line 18c (or ground line 44a) extends, therefore the resistance of ground lines 44a and 44b may be reduced, and the number of contact holes 17c and 17g serving as the shunt connection region on the memory cells may be reduced, resulting in a reduction in the occupied area. As a result, in highly integrating the semiconductor device, limitations associated with layout of other interconnections on the memory cell may be reduced.

Figure 2:
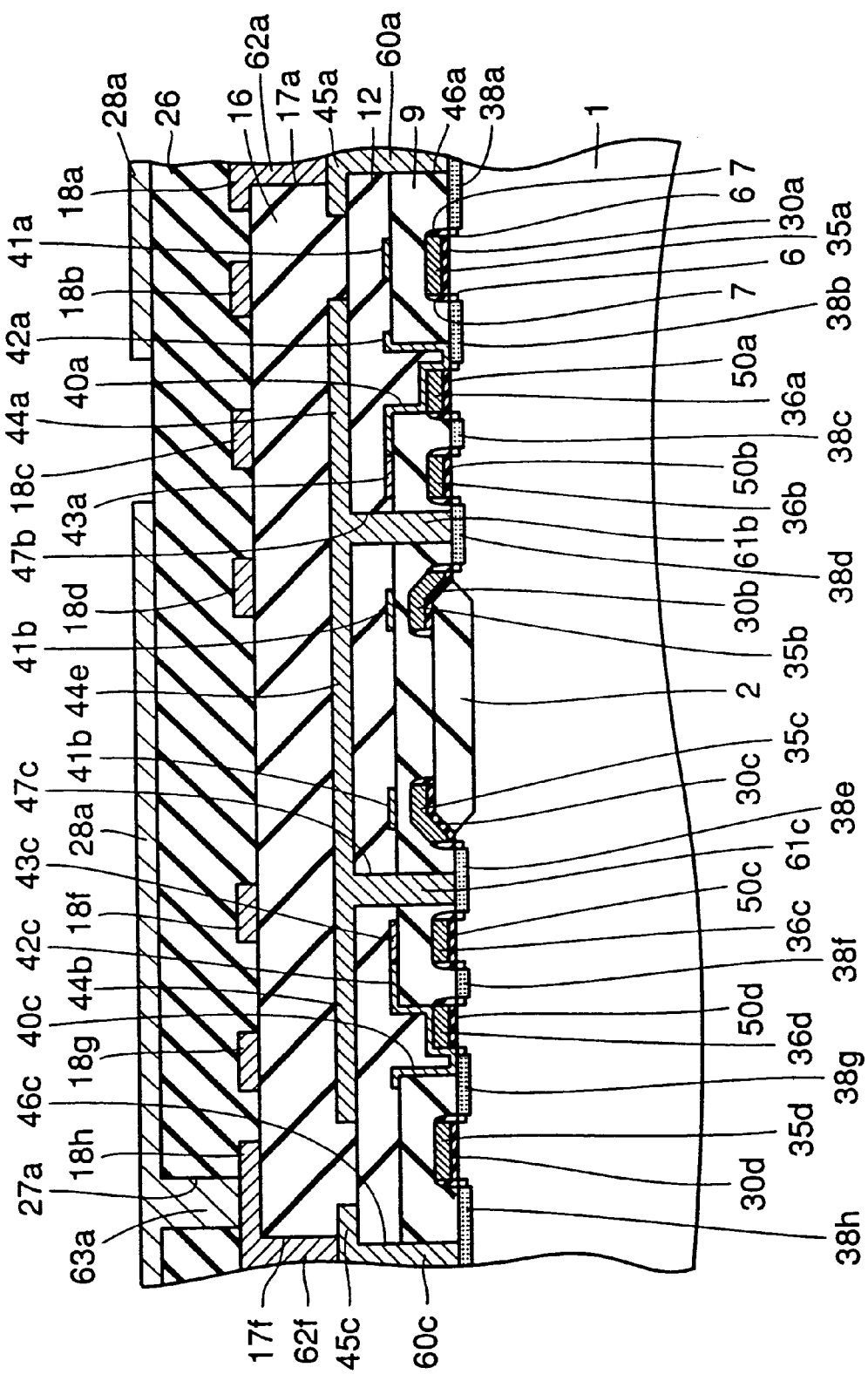
FIG. 2 is a cross sectional view taken along line 500—500 in FIG. 1.

Furthermore, referring to FIG. 1, contact hole 17c serving as a shunt connection region for ground line 44a is formed for two memory cells formed adjacent to each other in the direction in which bit line 28a extends, there is no shunt ground line to be directly connected with ground line 44b in the memory cells in which shunt word lines 18f and 18g are formed. In the memory cells formed adjacent to each other in the direction in which bit line 28a extends, shunt ground line 18c and ground line 44a are electrically connected with each other through plug 62c (see FIG. 3) formed in contact hole 17c. Referring to FIG. 2, memory cell ground lines 44a and 44b for the above two memory cells are electrically connected with each other through connection portion 44e, shunt ground line 18c may be electrically connected with ground line 44b in the memory cell on which no shunt ground line is formed. Therefore, in the memory cell having ground line 44b, ground line 44b may be reduced in resistance without forming a shunt ground line and a shunt connection region, which provides for low voltage operation of the device.

Referring to FIGS. 4 to 17, a method of manufacturing the semiconductor device according to the first embodiment will be described.

Figure 4:
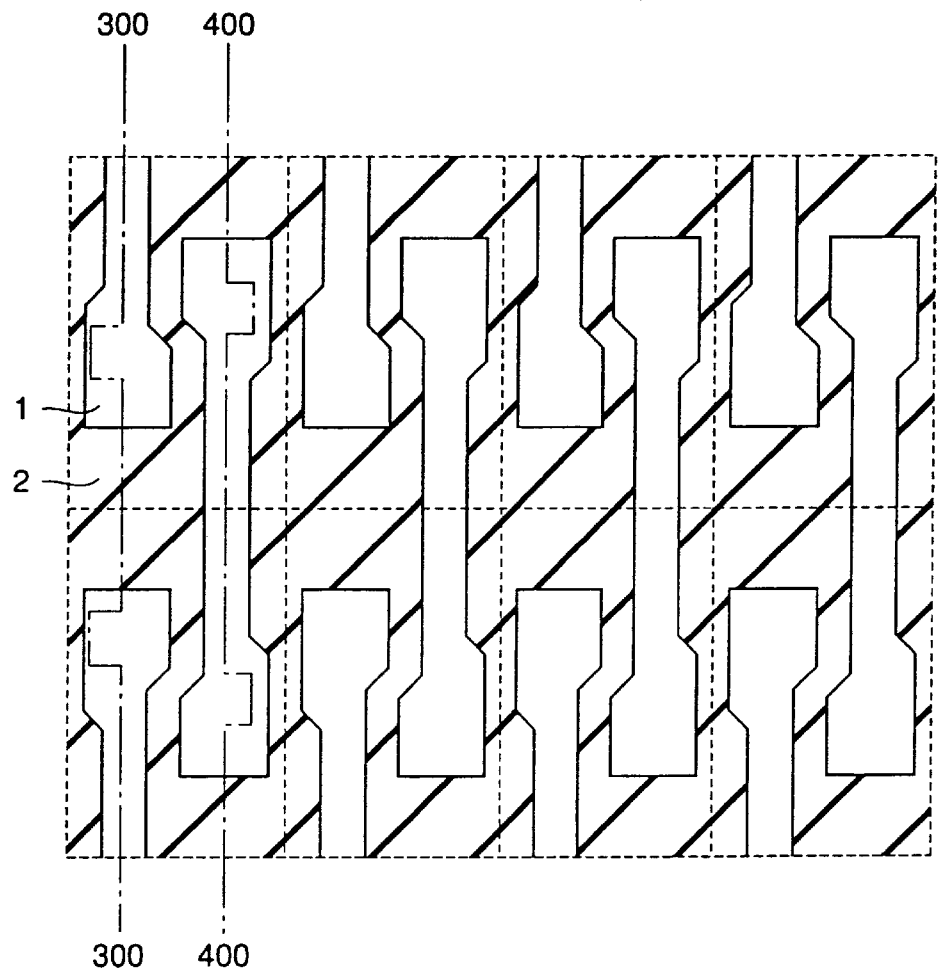
FIG. 4 is a two-dimensional layout for use in illustration of the first step in the manufacture of memory cells in the SRAM according to the first embodiment shown in FIG. 1.
Figure 5:
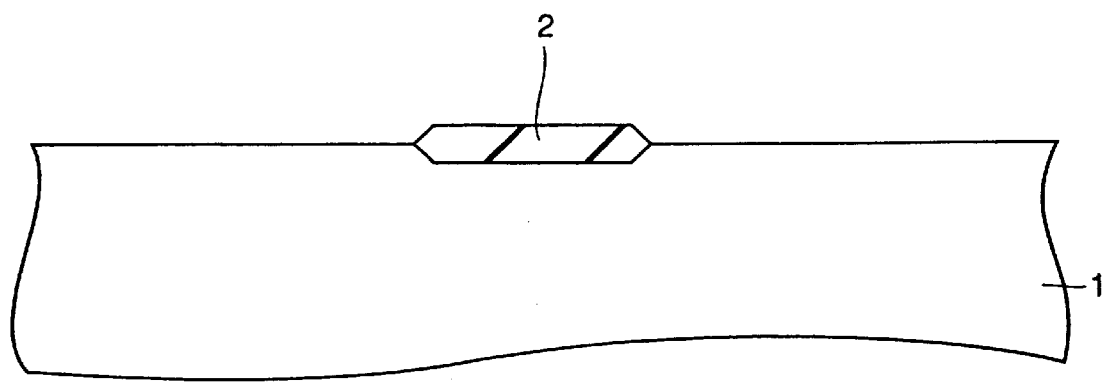
FIG. 5 is a cross sectional view taken along line 300—300 in FIG. 4.

A silicon nitride film (not shown) is deposited on a silicon oxide film (not shown) used as a pad film formed on n⁻ type semiconductor substrate 1 (see FIG. 4), and field insulating film 2 (see FIG. 4) of a silicon oxide film is formed by means of selective thermal oxidation (such as LOCOS: Local Oxidation of Silicon), using the silicon nitride film as an anti-oxidation mask. Field insulating film 2 has a thickness about in the range from 2000 to 5000 Å. The silicon oxide film used as the pad film and the silicon nitride film are then removed to expose a main surface of n⁻ type semiconductor substrate 1. Thus, the structure as shown in FIG. 4 results.

A p type impurity such as boron is then implanted into the entire main surface of n⁻ type semiconductor substrate 1 at an implantation energy in the range from 200 to 700 keV, and in a dose about in the range from $10^{12}$ to $10^{13}$/cm² followed by further implantation of a p type impurity such as boron at an implantation energy about in the range from 30 to 70 keV and in a dose of about $3.0 \times 10^{12}$/cm², to set threshold voltages for access transistors and driver transistors. Thus formed p⁻ type well region (not shown) has an impurity concentration about in the range from $10^{16}$ to $10^{18}$/cm³.

Figure 6:
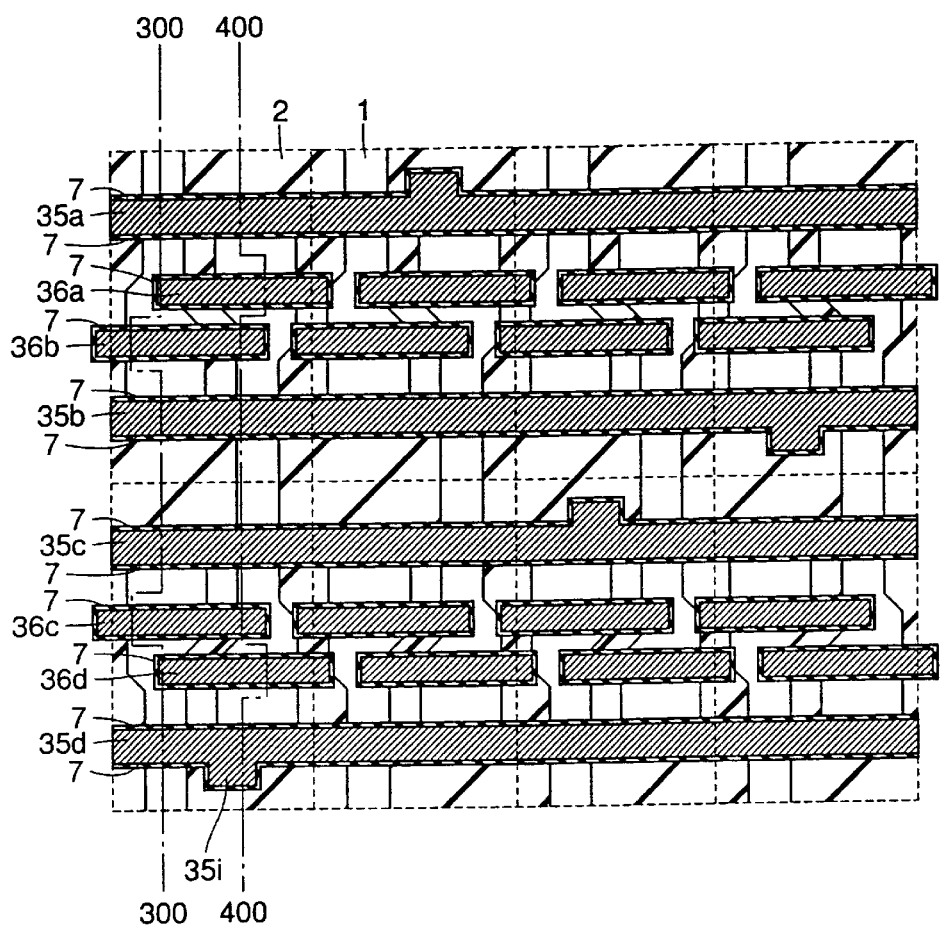
FIG. 6 is a two-dimensional layout for use in illustration of the second step in the manufacture of the memory cells in the SRAM according to the first embodiment shown in FIG. 1.
Figure 7:
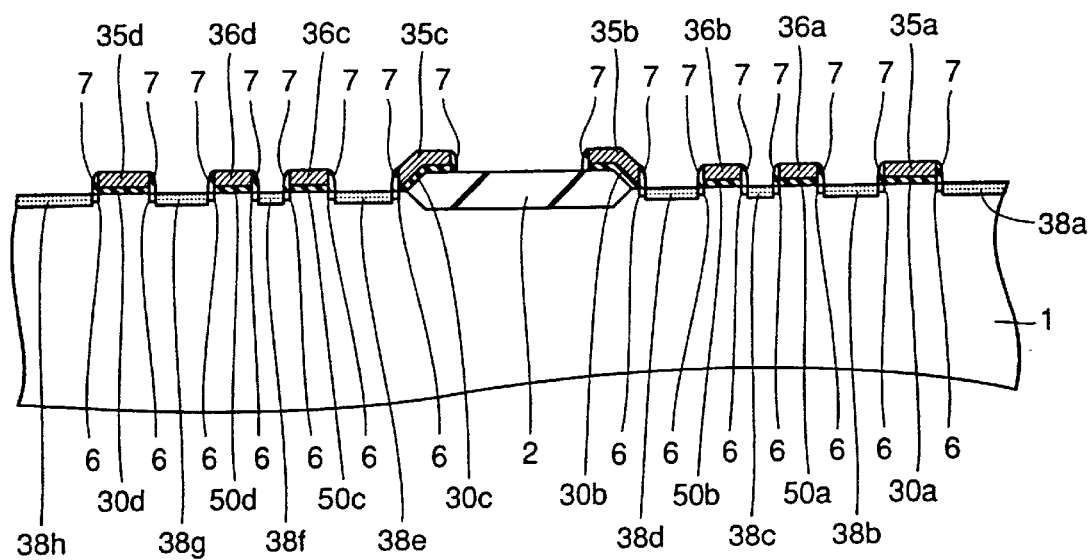
FIG. 7 is a cross sectional view taken along line 300—300 shown in FIG. 6.
Figure 8:
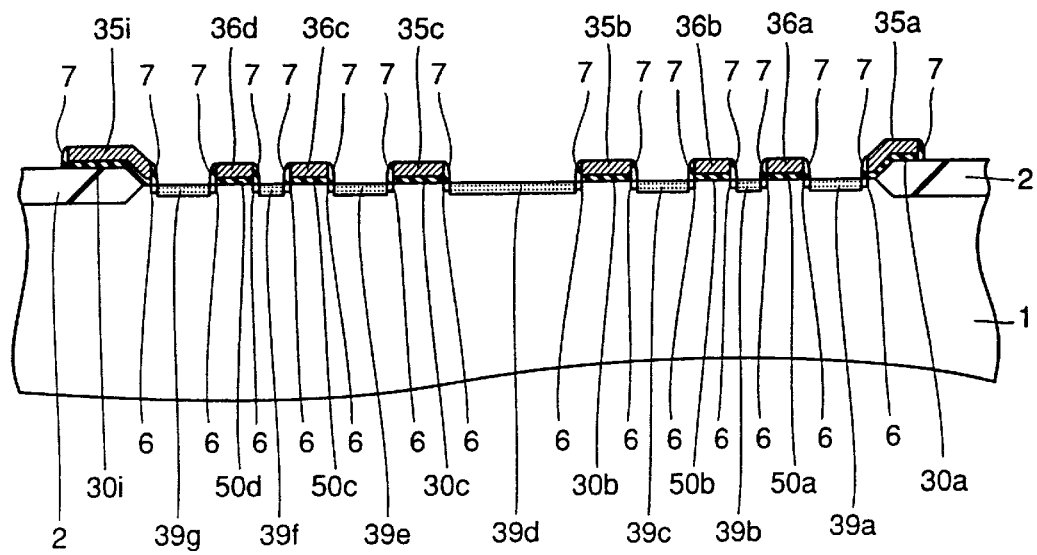
FIG. 8 is a cross sectional view taken along line 400—400 shown in FIG. 6.

Then, the entire structure is subjected to thermal oxidation to form a gate insulating film (not shown) of a silicon oxide film. The gate insulating film has a thickness of about in the range from 40 to 100 Å. A phosphorous doped polysilicon film (not shown) is deposited on the gate insulating film by means of LPCVD (Low Pressure Chemical Vapor Deposition) in a mixture gas atmosphere containing phosphine (PH3). The phosphorous doped polysilicon film has a thickness about in the range from 500 to 2000 Å and the concentration of the phosphorous is about in the range from 1.0 to $8.0 \times 10^{20}$/cm³. A resist pattern is formed on the phosphorous doped polysilicon film, and the gate insulating film and the phosphorous doped polysilicon film are etched away by means of RIE (Reactive Ion Etching) using the resist pattern as a mask. Thus, word lines 35a to 35d (see FIG. 6), the gate electrodes 36a to 36d (see FIG. 6) of driver transistors and gate insulating films 30a to 30d and 50a to 50d (see FIG. 7) are formed. The entire surface is then implanted with arsenic, for example, while rotating the wafer at an implantation angle of 45°. The implantation energy at the time is about in the range from 30 to 70 keV, and the dose is about in the range from 1.0 to $5.0 \times 10^{13}$/cm². Thus, n⁻ type source/drain regions 6 (see FIG. 7) are formed. N⁻ type source/drain region 6 has an impurity concentration about in the range from $10^{17}$ to $10^{19}$/cm³. A silicon oxide film (not shown) having a thickness about in the range from 500 Å to 2000 Å is deposited on the entire substrate by means of LPCVD. Then, the silicon oxide film is anisotropically etched away by means of RIE to form sidewall oxide films 7 (see FIG. 7) on sides of word lines 35a to 35d and the gate electrodes 36a to 36d of the driver transistors. Sidewall oxide film 7 has a width about in the range from 500 to 2000 Å. Then, arsenic, for example, is implanted onto the main surface of n⁻ type semiconductor substrate to form n⁺ type source/drain regions 38a to 38h (see FIG. 7). The arsenic is implanted at the time at an implantation energy of about 50 keV, and in a dose about in the range from 1.0 to $5.0 \times 10^{15}/\text{cm}^2$. The impurity concentration of n⁺ type source/drain regions 38a to 38h is about in the range from $10^{20}$ to $10^{21}/\text{cm}^3$. Thus, the structure as shown in FIGS. 6 to 8 results. Referring to FIG. 7, n⁻ type source/drain region 6 and each of n⁺ type source/drain regions 38a to 38h form a so-called LDD structure.

An interlayer insulating film 9 (see FIG. 10) formed of a silicon oxide film having a thickness about in the range from 1000 to 10000 Å is formed to cover the entire substrate by means of LPCVD. A resist pattern (not shown) is formed on interlayer insulating film 9. Using the resist pattern as a mask, a part of interlayer insulating film 9 is anisotropically etched away to form contact holes 40a to 40d (see FIG. 9). The anisotropic etching may be by means of RIE. At the bottoms of contact holes 40a to 40d, part of the gate electrodes 36a to 36d of the driver transistors and a part of n⁺ type source/drain regions 38b, 38g (see FIG. 10), 39c and 39e (see FIG. 11) are exposed.

After removing a natural oxide film by means of wet etching using hydrofluoric acid, a polysilicon film (not shown) having a thickness about in the range from 200 to 1000 Å is deposited on interlayer insulating film 9 (see FIG. 10) and in contact holes 40a to 40d (see FIGS. 10 and 11) by means of LPCVD. A resist pattern is formed on the polysilicon film. Using the resist pattern as a mask, a part of the polysilicon film is anisotropically etched away. The anisotropic etching is by means of RIE. The resist pattern is then removed.

The entire substrate is implanted with phosphorous at an implantation energy of about 30 keV, in a dose about in the range from $10^{12}$ to $10^{14}/\text{cm}^2$. A resist pattern (not shown) is formed to mask at least regions to be high resistance portions 43a to 43d (see FIG. 9), and using the resist pattern as a mask, arsenic is implanted into the polysilicon film. The arsenic is implanted at an implantation energy of about 20 keV and in a dose about in the range from $10^{14}$ to $10^{15}/\text{cm}^2$.

Figure 9:
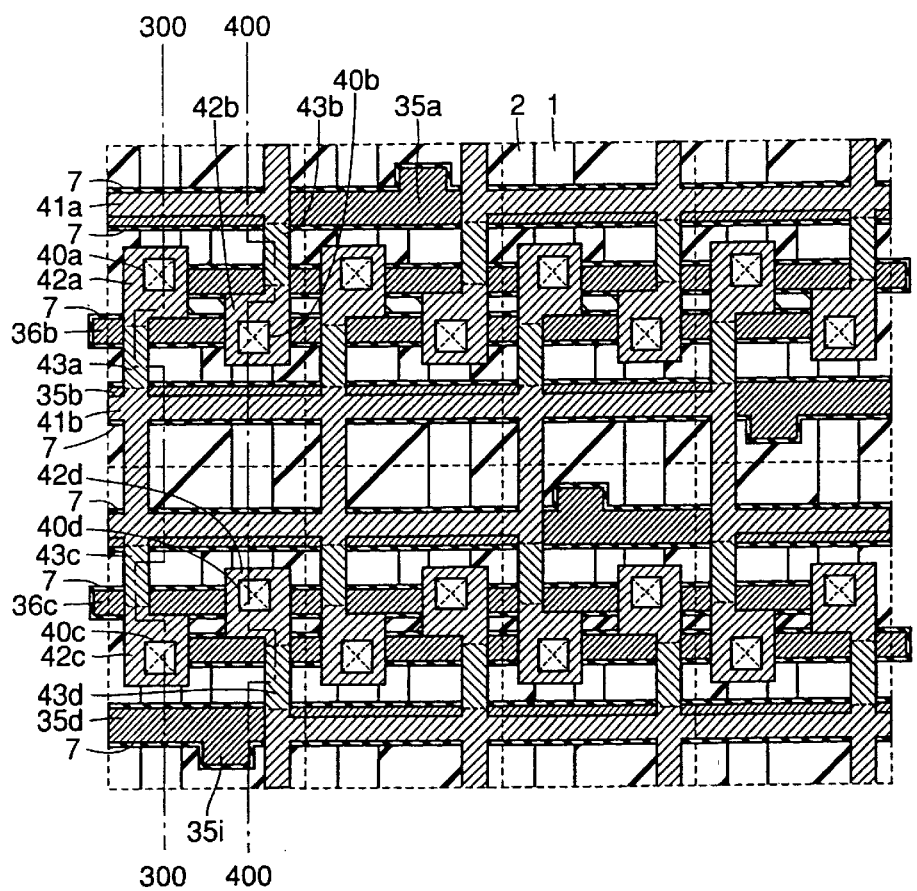
FIG. 9 is a two-dimensional layout for use in illustration of the third step in the manufacture of the memory cells in the SRAM according to the first embodiment shown in FIG. 1.
Figure 10:
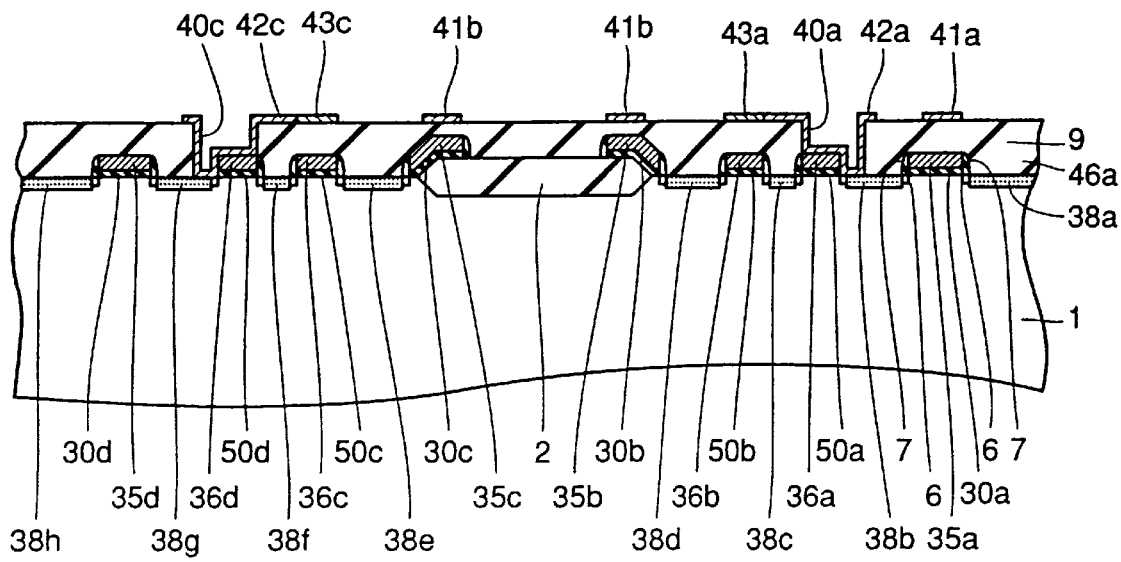
FIG. 10 is a cross sectional view taken along line 300—300 shown in FIG. 9.
Figure 11:
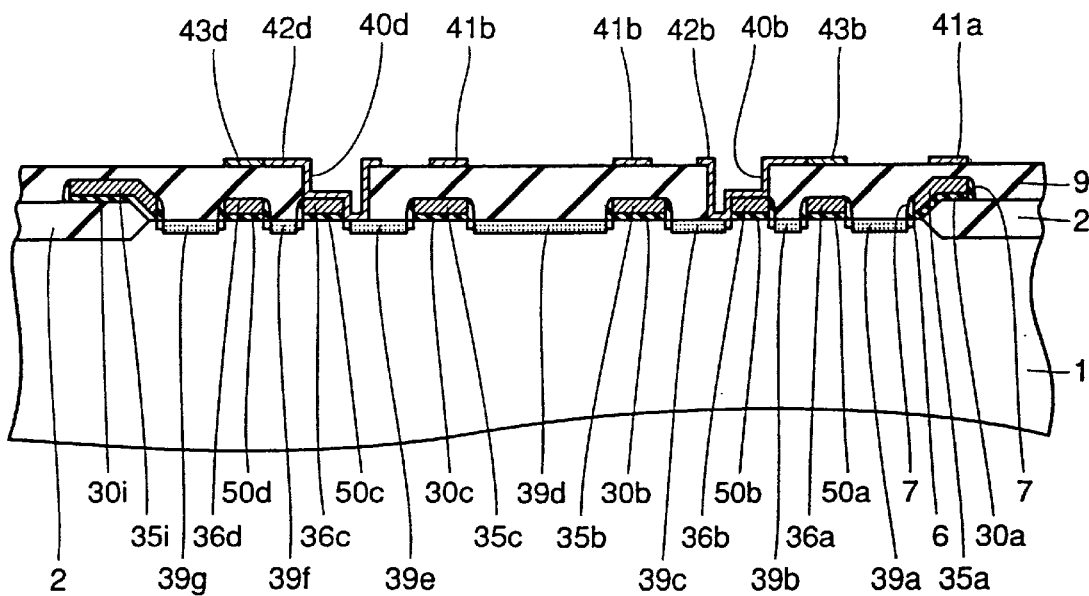
FIG. 11 is a cross sectional view taken along line 400—400 shown in FIG. 9.

Thus, low resistance plugs 42a to 42d (see FIG. 9) to serve as storage node portions and Vcc interconnection layers 41a and 41b (see FIG. 9) are formed. The resist pattern is then removed away. The regions not implanted with the arsenic have high electrical resistances, and serve as high resistance portions 43a to 43d. High resistance portions 43a to 43d have a resistance value about in the range from 100M to 10 TΩ/line, while plugs 42a to 42d and Vcc interconnection portions 41a and 41b each have a sheet resistance value in the range from about 1 k to 100 kΩ. Thus, the structure as shown in FIGS. 9 to 11 results. Herein, Vcc interconnections 41a and 41b serving as power supply lines are placed so as not to two-dimensionally overlap contact hole 17e (see FIG. 1) to connect shunt word line 18g (see FIG. 1) to word line 35d, and therefore contact hole 17e serving as a shunt connection region may be formed in a region two-dimensionally overlapping the memory cell region even in the structure having Vcc interconnections 41a and 41b present in the region positioned between word line 35d and shunt word line 18g.

Then, an interlayer insulating film 12 (see FIG. 13) of a silicon oxide film having a thickness about in the range from 1000 to 10000 Å is deposited on the entire substrate by means of LPCVD. After forming a resist pattern (not shown) on interlayer insulating film 12, using the resist pattern as a mask, part of interlayer insulating films 12 and 9 is removed to form contact holes 47a to 47d and contact holes 46a to 46c (see FIGS. 13 and 14) at prescribed regions, followed by removal of the resist pattern.

Figure 12:
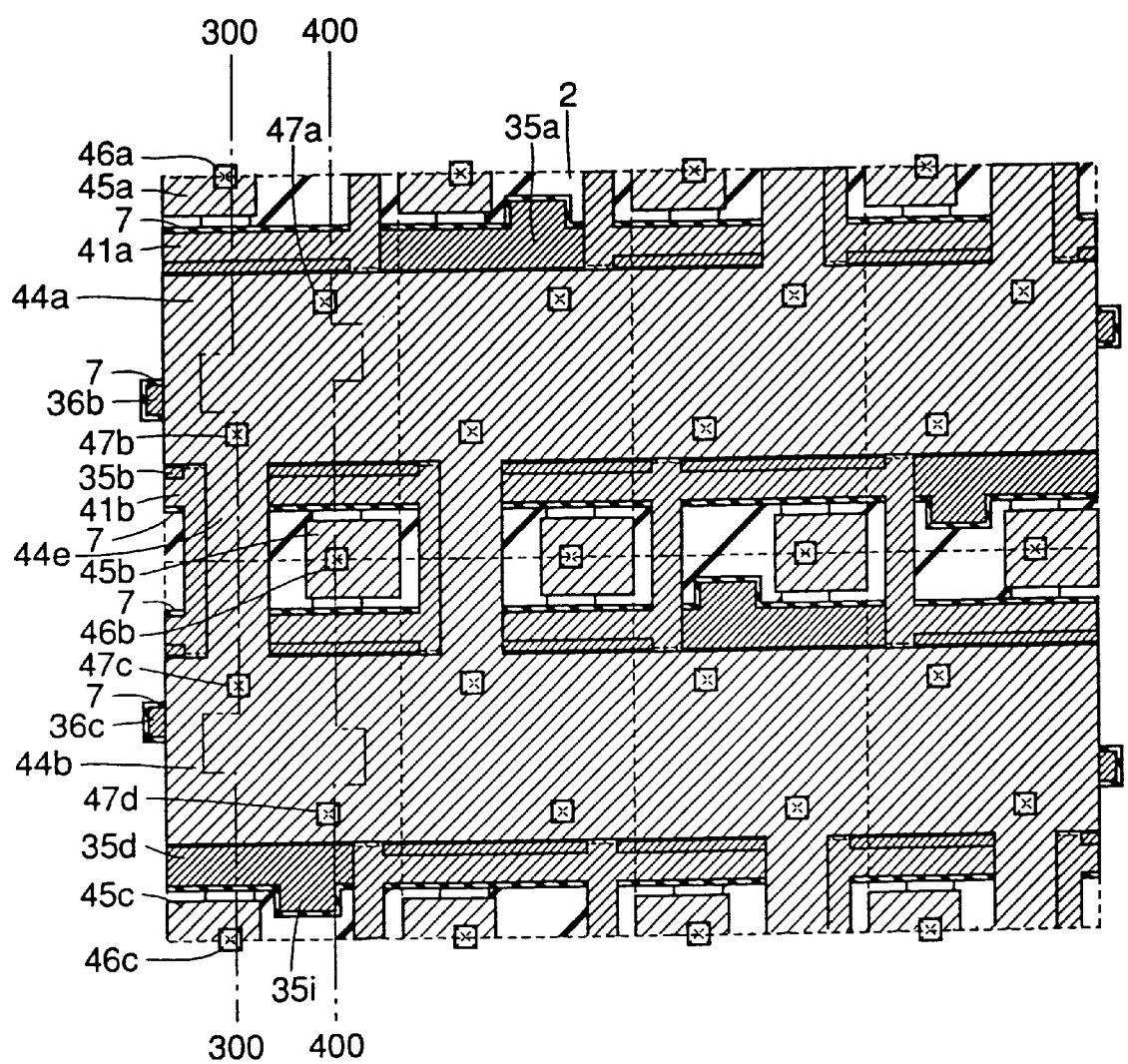
FIG. 12 is a two-dimensional layout for use in illustration of the fourth step in the manufacture of the memory cells in the SRAM according to the first embodiment shown in FIG. 1.
Figure 13:
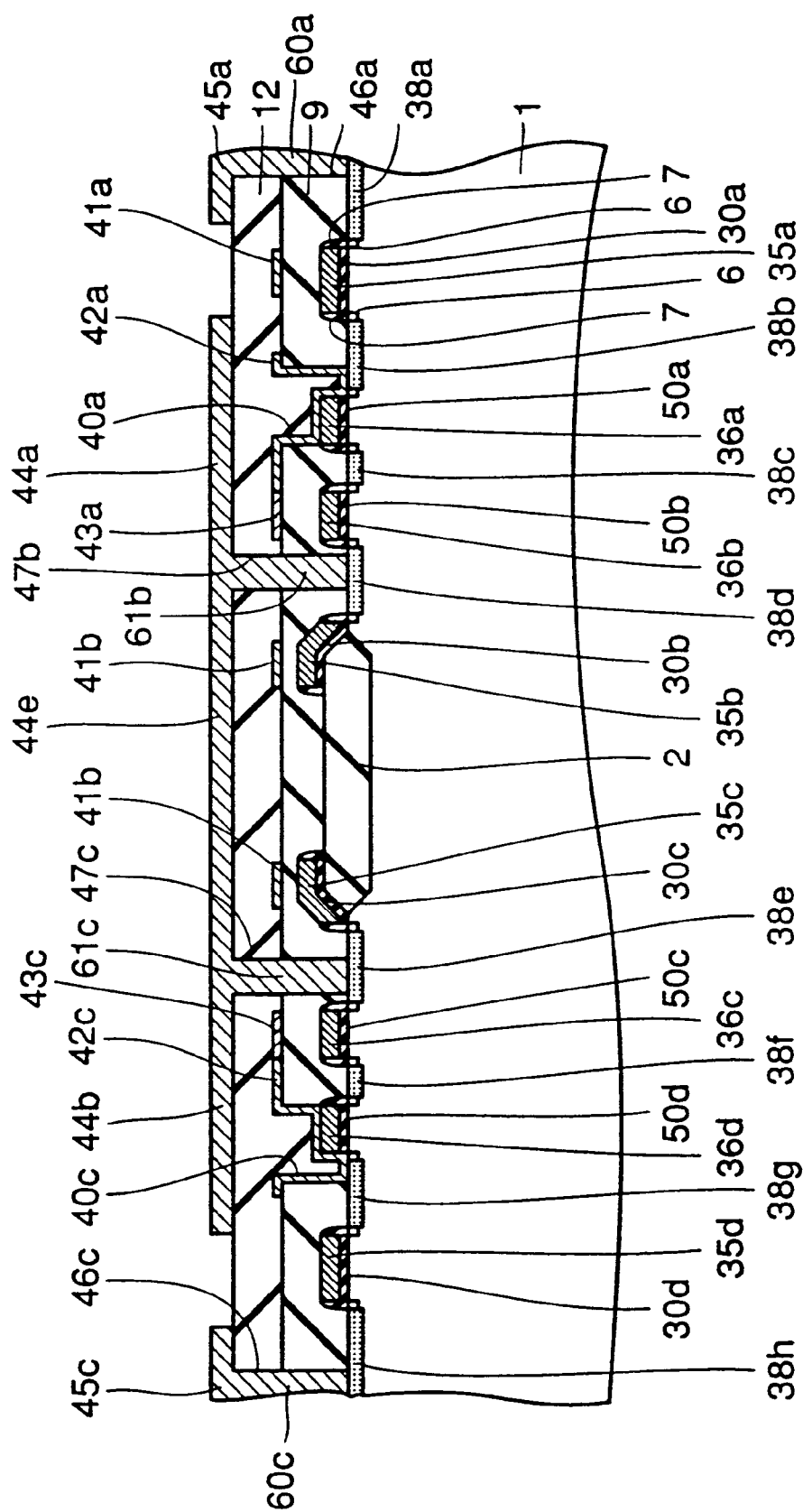
FIG. 13 is a cross sectional view taken along line 300—300 shown in FIG. 12.
Figure 14:
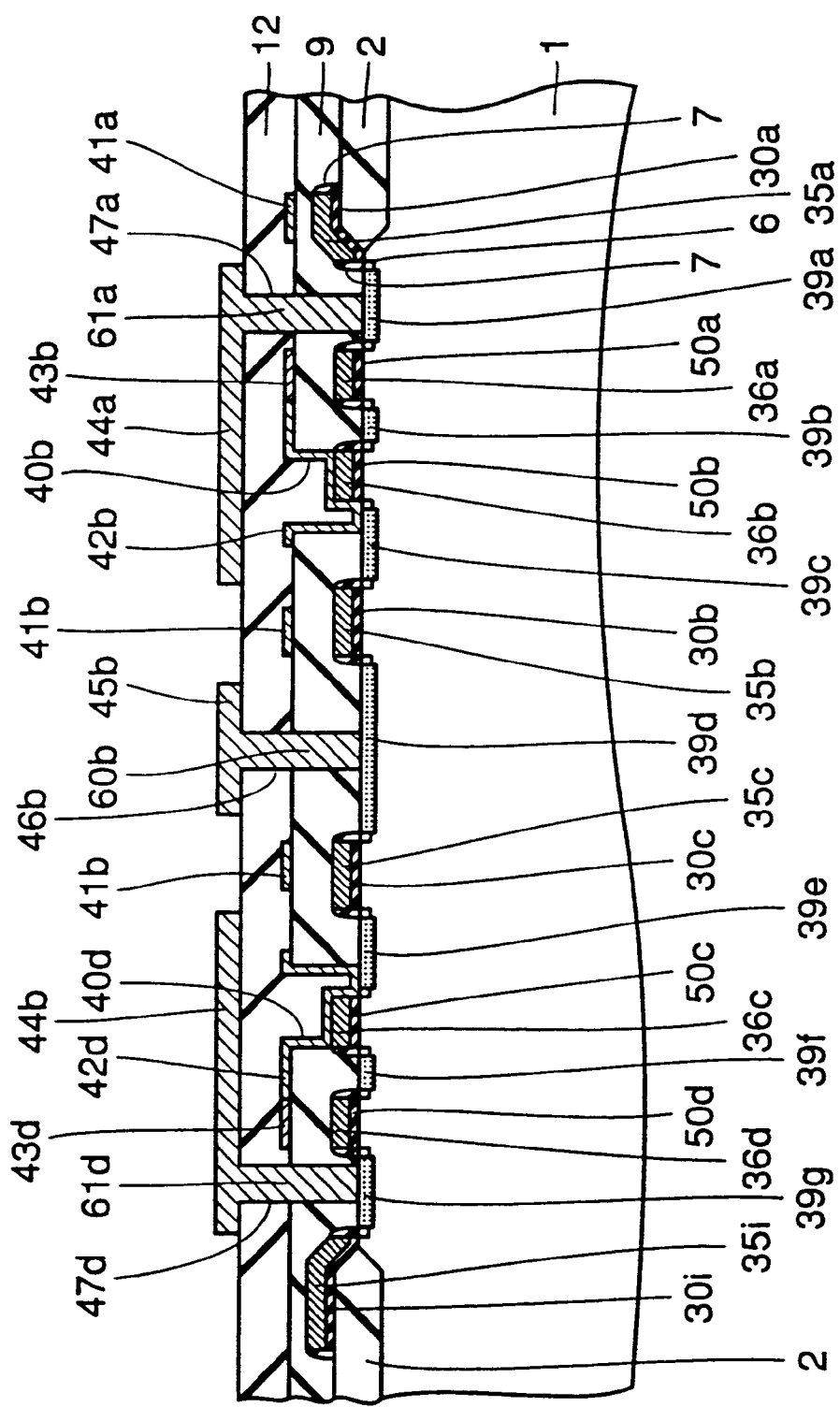
FIG. 14 is a cross sectional view taken along line 400—400 shown in FIG. 12.

After removing a natural oxide film by means of wet etching using hydrofluoric acid, a phosphorous-doped polysilicon film (not shown) having a thickness about in the range from 1000 to 2000 Å is formed on interlayer insulating film 12 and in contact holes 46a to 46c and 47a to 47d by means of LPCVD. The concentration of the phosphorous in the phosphorous-doped polysilicon film is about in the range from 1.0 to $8.0 \times 10^{20}/\text{cm}^3$. A resist pattern (not shown) is formed on the polysilicon film, and using the resist pattern as a mask, a part of the doped polysilicon film is anisotropically etched away to form bit line contact pads 45a to 45c, ground line contact plugs 61a to 61d (see FIGS. 13 and 14) and ground lines 44a and 44b (see FIG. 13). Thus, the structure as shown in FIGS. 12 to 14 results.

Herein, ground lines 44a and 44b are provided so as not to two-dimensionally overlap contact hole 17e (see FIG. 1) serving as a shunt connection region for word line 35d, the shunt connection region for the word line may be formed overlapping the memory cell region even in the structure having ground lines 44a and 44b between word line 35d and shunt word line 18g (see FIG. 1).

Note that, herein, bit contact pads 45a to 45c and ground lines 44a and 44b are formed only of the phosphorous-doped polysilicon film, they may be so-called polycide interconnections formed of a metal silicide film such as a tungsten silicide film and a phosphorous doped polysilicon film. The sheet resistance value of the polysilicon film forming the bit line contact pads 45a to 45c and ground lines 44a and 44b is about in the range from 10 to 100 Å.

An interlayer insulating film 16 of a silicon oxide film (see FIG. 16) having a thickness about in the range from 3000 to 10000 Å is deposited to cover the entire surface of the substrate by means of LPCVD. After forming a resist pattern (not shown) on interlayer insulating film 16, using the resist pattern as a mask, a part of interlayer insulating films 16, 12 and 9 (see FIG. 16) is anisotropically etched away to form contact holes 17a, 17d and 17f for bit lines, ground line shunt contact holes 17c and 17g and word line shunt contact holes 17b, 17e, 17i and 17h (see FIG. 15). Then, bit line connection portions 18a, 18e and 18h of aluminum having a thickness about in the range from 1000 to 5000 Å as a first metal interconnection, shunt word lines 18b, 18d, 18f and 18g, and shunt ground line 18c (see FIG. 15) are formed. The sheet resistance value of the first layer metal interconnection layer is about in the range from 0.05 to 1 Ω. Thus, the structure as shown in FIGS. 15 to 17 results.

Figure 17:
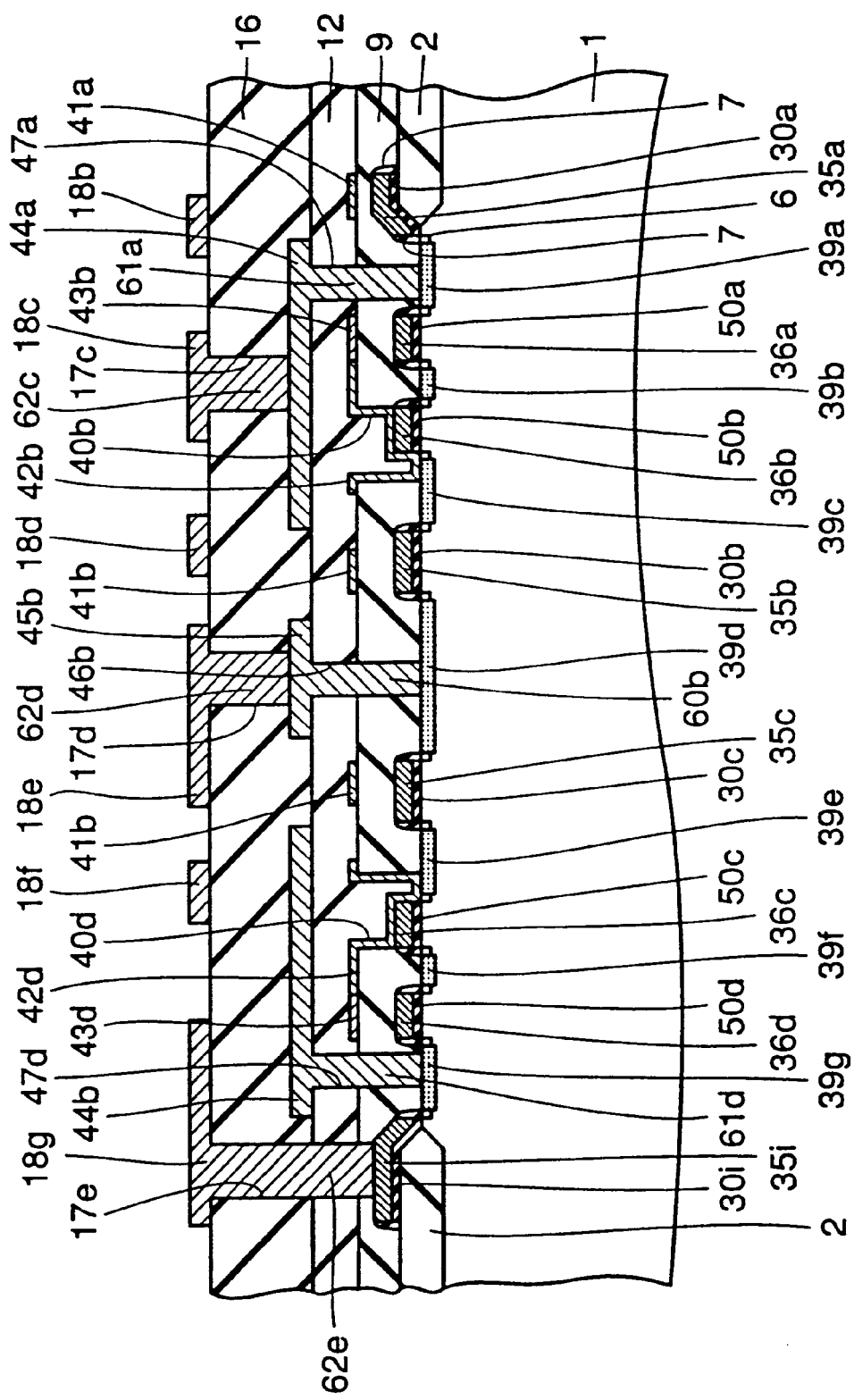
FIG. 17 is a cross sectional view taken along line 600—600 in FIG. 15.

Herein, referring to FIG. 17, shunt word line 18g of a metal layer such as aluminum is electrically connected with shunt connection region 35i for word line through plug 62e formed in contact hole 17e, and therefore a signal may be transmitted to word line 35d (see FIG. 6) through shunt word line 18g. Similarly, a signal may be transmitted through shunt word lines 18b, 18d and 18f to other word lines 35a to 35c (see FIG. 6). As a result, word lines 35a to 35d may be reduced in resistance, which gives rise to increase in the operation speed of the semiconductor device.

Referring to FIG. 17, shunt ground line 18c of a metal layer is electrically connected with ground line 44a through plug 62c formed in contact hole 17c, and therefore current passed to ground line 44a may be passed to low electrical resistance shunt ground line 18c. As a result, ground line 44a may be reduced in resistance, which stabilizes the potential of ground line 44a at the ground level, and the operation of the semiconductor device is permitted at lower voltages.

Figure 15:
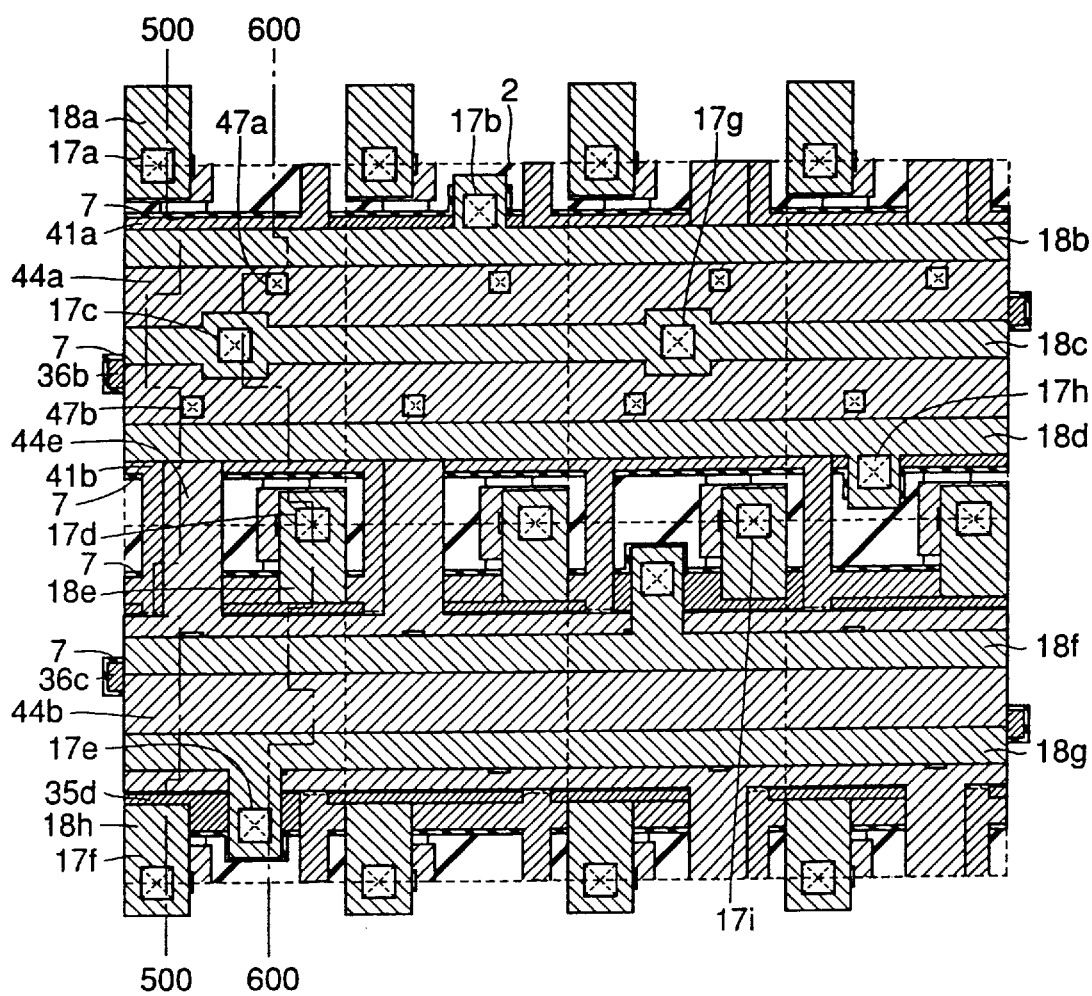
FIG. 15 is a two-dimensional layout for use in illustration of the fifth step in the manufacture of the memory cell in the SRAM according to the first embodiment shown in FIG. 1.
Figure 16:
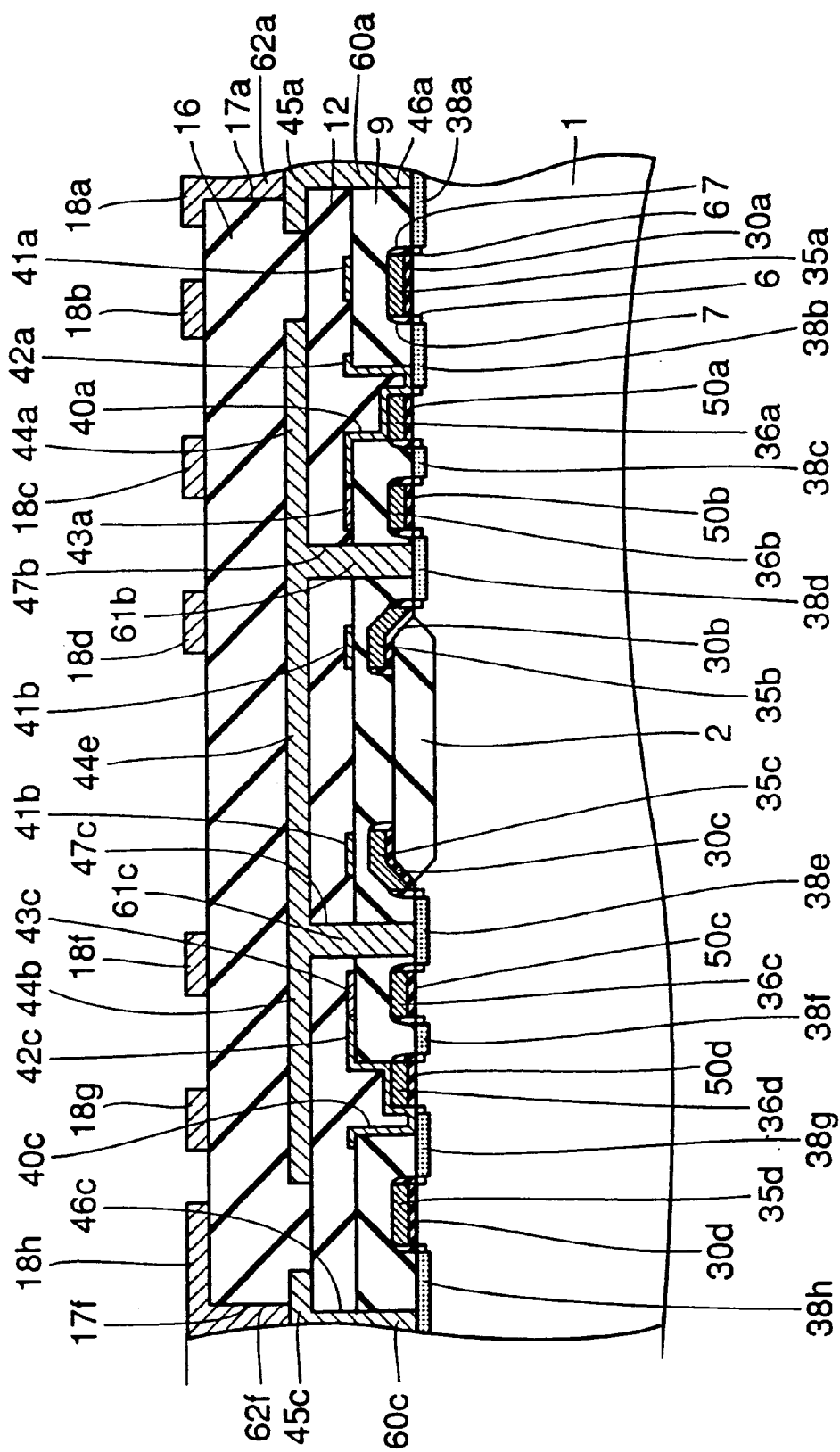
FIG. 16 is a cross sectional view taken along line 500—500 in FIG. 15.

Referring to FIG. 15, there are shunt word lines 18b, 18d and 18f and 18g, two of which correspond to each of a plurality of memory cells provided adjacent to each other in a direction almost orthogonal to shunt word line 18g, the number of shunt word lines per word line may be increased as compared to the conventional case. As a result, the resistance of word lines 35a, 35b, 35c and 35d (see FIGS. 2 and 3) may be reduced as compared to the conventional case.

Referring to FIG. 15, since contact hole 17e for shunt word line 18g and contact hole 17c for shunt ground line 18c are formed in a region two-dimensionally overlapping the memory cells. This is also true to the contact holes for shunt word lines 18b, 18d and 18f. Therefore, the regions for connecting shunt word lines 18b, 18d, 18f and 18g and word lines 35a to 35d and the region for connecting shunt ground line 18c and ground line 44a do not have to be secured outside the memory cells. Thus, a semiconductor device may be further integrated as compared to the case of providing the shunt connection region outside the memory cells.

Referring to FIG. 15, contact hole 17e serving as the shunt connection region for connecting shunt word line 18g and connection portion 35i (see FIG. 3) for word line 35d is formed for four memory cells formed adjacent to each other in the direction in which shunt word line 18g extends, therefore word line 35d may be reduced in resistance, the number of contact holes 17e serving as the shunt connection region on the memory cells may be reduced, and the area occupied thereby may be reduced as well. Thus, in increasing the integration density of the semiconductor device, limitations associated with layout of other interconnections such as ground lines 44a and 44b on the memory cells may be reduced.

Furthermore, contact holes 17c and 17g serving as a shunt connection region for connecting shunt ground line 18c and ground line 44a may be each formed for two memory cells formed adjacent to each other in the direction in which bit shunt ground line 18c (or ground line 44a) extends, and therefore the number of contact holes 17c and 17g serving as a shunt connection region on the memory cells may be reduced while reducing the resistance of ground line 44a, which results in a reduction in the area occupied thereby. Thus, in further integrating the semiconductor device, limitations associated with layout of other interconnections on the memory cells may be reduced.

Contact holes 17c serving as the shunt connection region for ground line 44a are each formed for two memory cells formed adjacent to each other in the direction in which bit line 28a extends, and therefore there is no shunt ground line to be directly connected with ground line 44a in a memory cell in which shunt word lines 18f and 18g are formed. However, in a memory cell formed adjacent to this memory cell in the direction in which bit line 28a extends, shunt ground line 18c and ground line 44a are electrically connected with each other through contact hole 17c. Ground lines 44a and 44b for these two memory cells are electrically connected with each other through connection portion 44e (see FIGS. 16 and 17), and shunt ground line 18c is electrically connected with ground line 44b in the memory cell in which shunt ground line 18c is not formed. Thus, in the memory cell in which ground line 44b is formed, ground line 44b may be reduced in resistance without forming a shunt ground line and a shunt connection region, which results in a reduction in the operation voltage of the semiconductor device.

Following the steps as shown in FIGS. 15 to 17, an interlayer insulating film 26 (see FIG. 2) of a silicon oxide film having a thickness about in the range from 5000 to 10000 Å (see FIG. 2) is deposited to cover the entire substrate by means of LPCVD. A resist pattern is formed of interlayer insulating film 26, and using the resist pattern as a mask, a part of interlayer insulating film 26 is anisotropically etched away to form contact holes 27a and 27b (see FIG. 1), followed by removal of the resist pattern.

Bit lines 28a to 28h formed of aluminum layers each having a thickness about in the range from 3000 to 10000 Å are formed as second layer metal interconnections. The sheet resistance value of the second layer metal interconnections is about in the range from 0.01 to 0.1 Ω. Thus, the semiconductor device shown in FIGS. 1 to 3 results.

Second Embodiment

Figure 18:
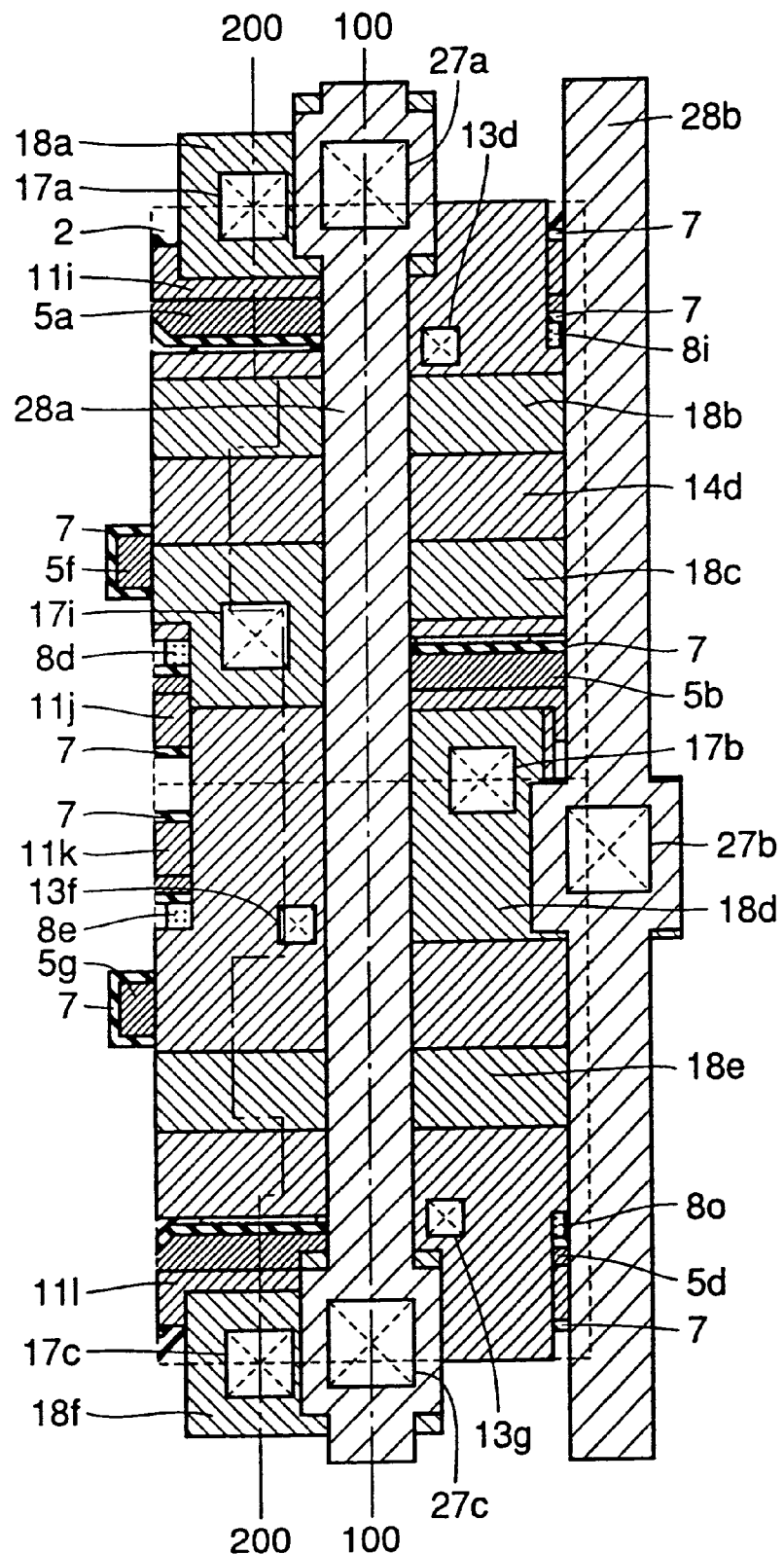
FIG. 18 is a two-dimensional layout showing two adjacent memory cells in an SRAM according to a second embodiment of the invention.
Figure 19:
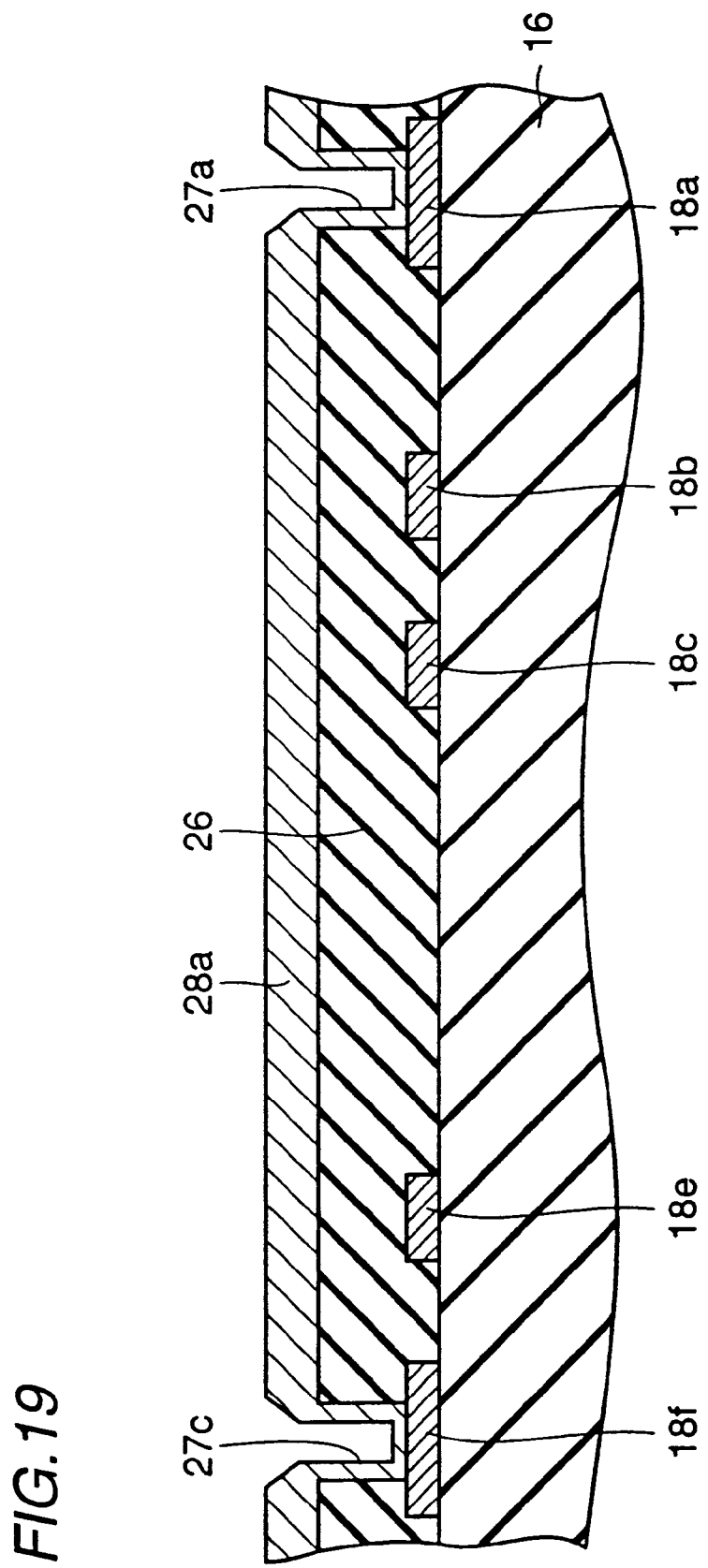
FIG. 19 is a part of a cross sectional view taken along line 100—100 in FIG. 18.
Figure 20:
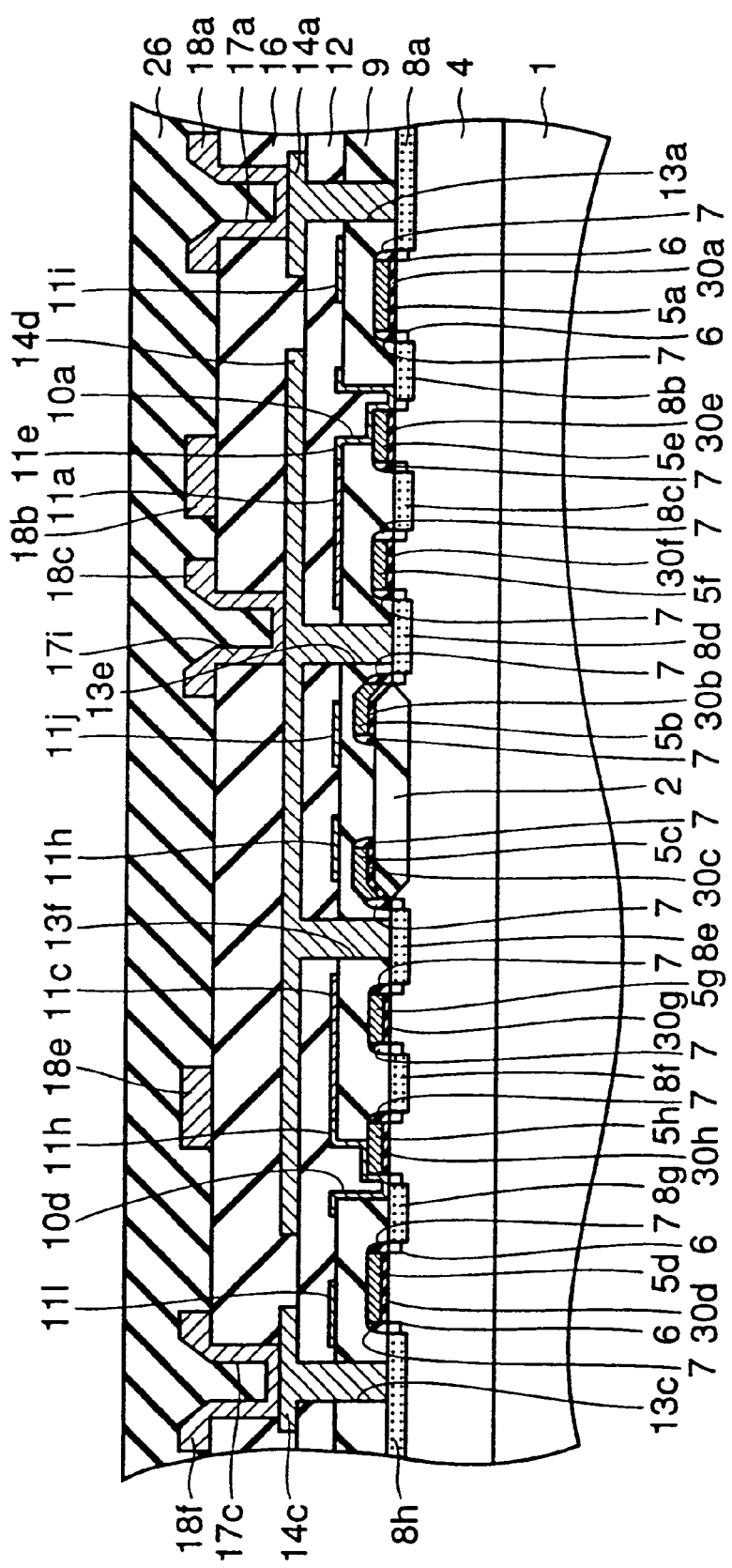
FIG. 20 is a cross sectional view taken along line 200—200 in FIG. 18.
Figure 21:
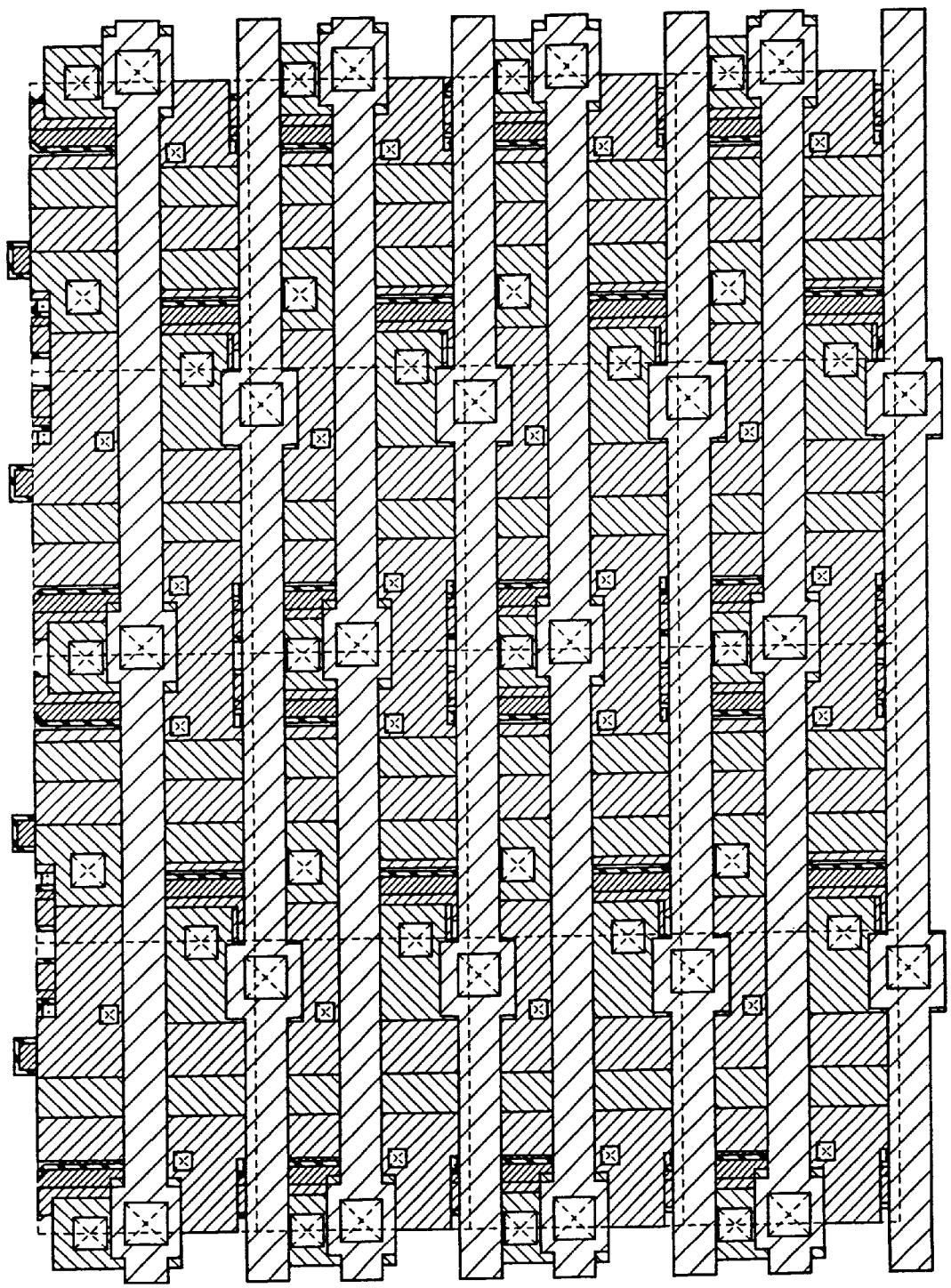
FIG. 21 is a two-dimensional layout showing memory cells arranged in a matrix of four rows×four columns in the SRAM according to the second embodiment shown in FIG. 18.
Figure 22:
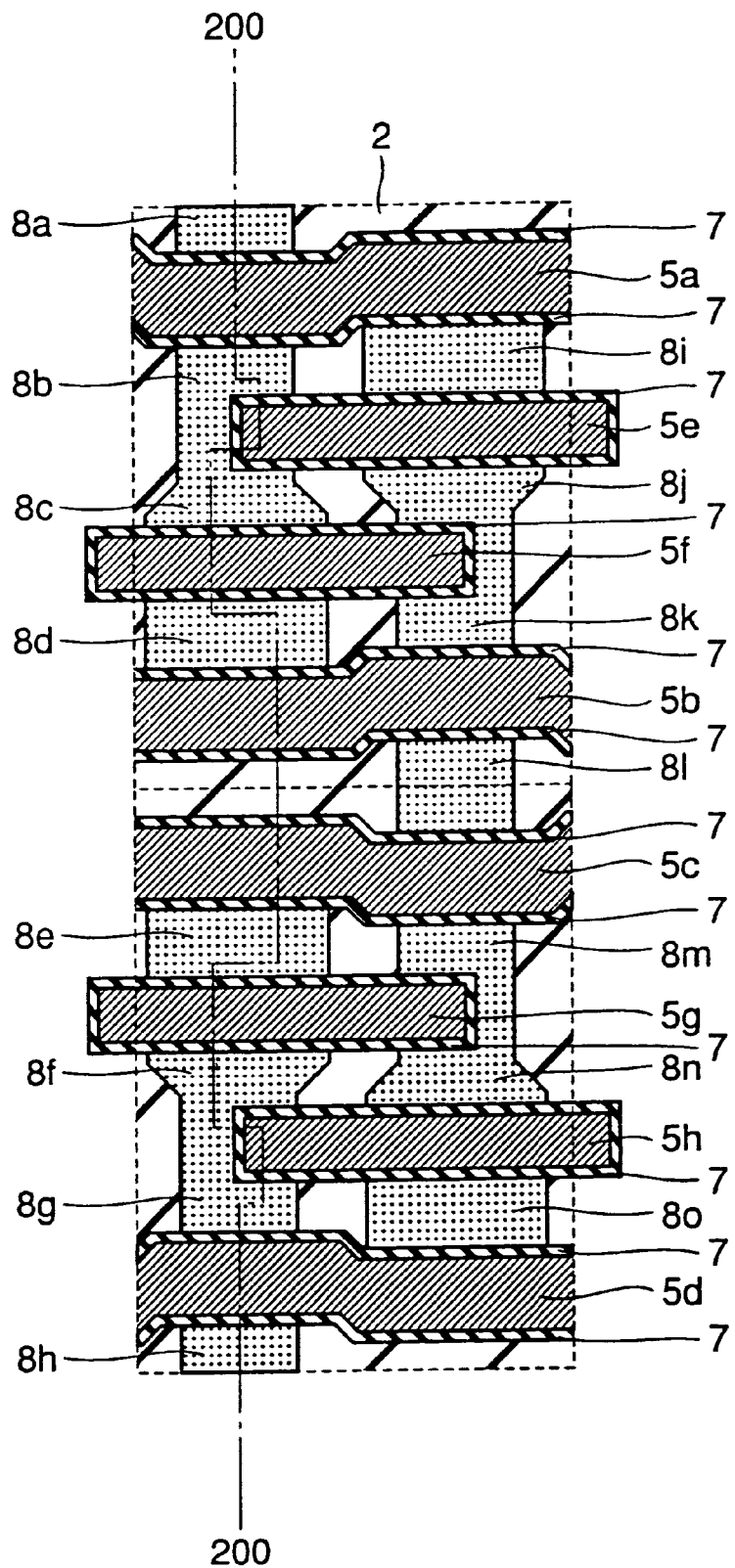
FIG. 22 is a two-dimensional layout for use in illustration of the first step in the manufacture of the memory cells in the SRAM according to the second embodiment shown in FIG. 18.
Figure 23:
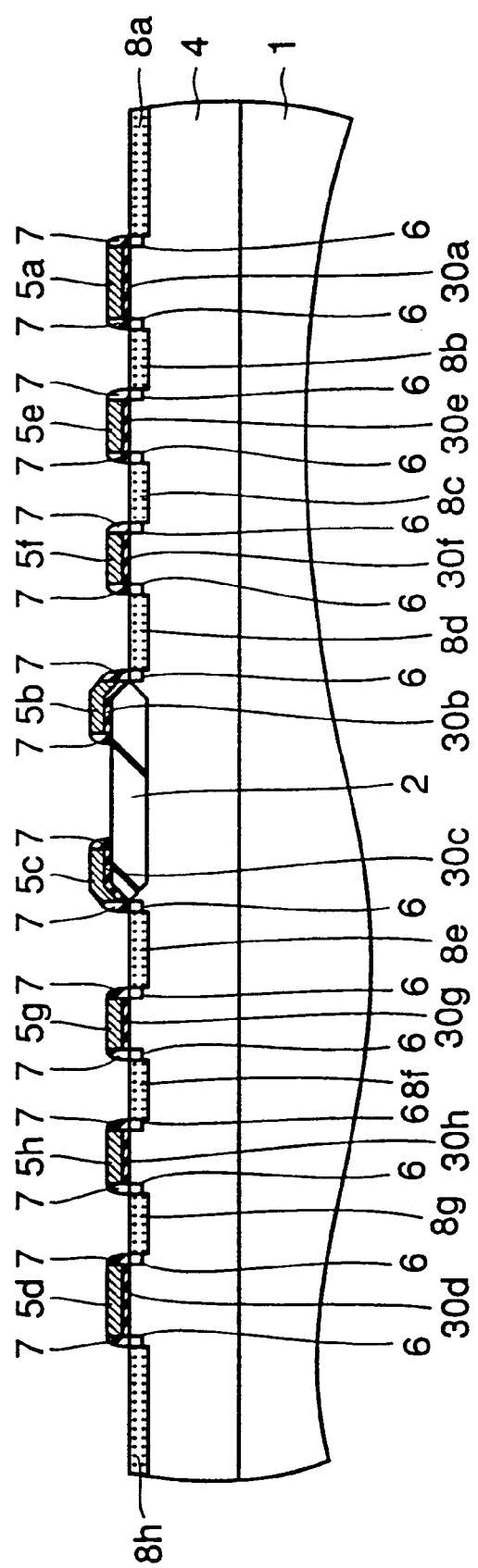
FIG. 23 is a cross sectional view taken along line 200—200 in FIG. 22.
Figure 24:
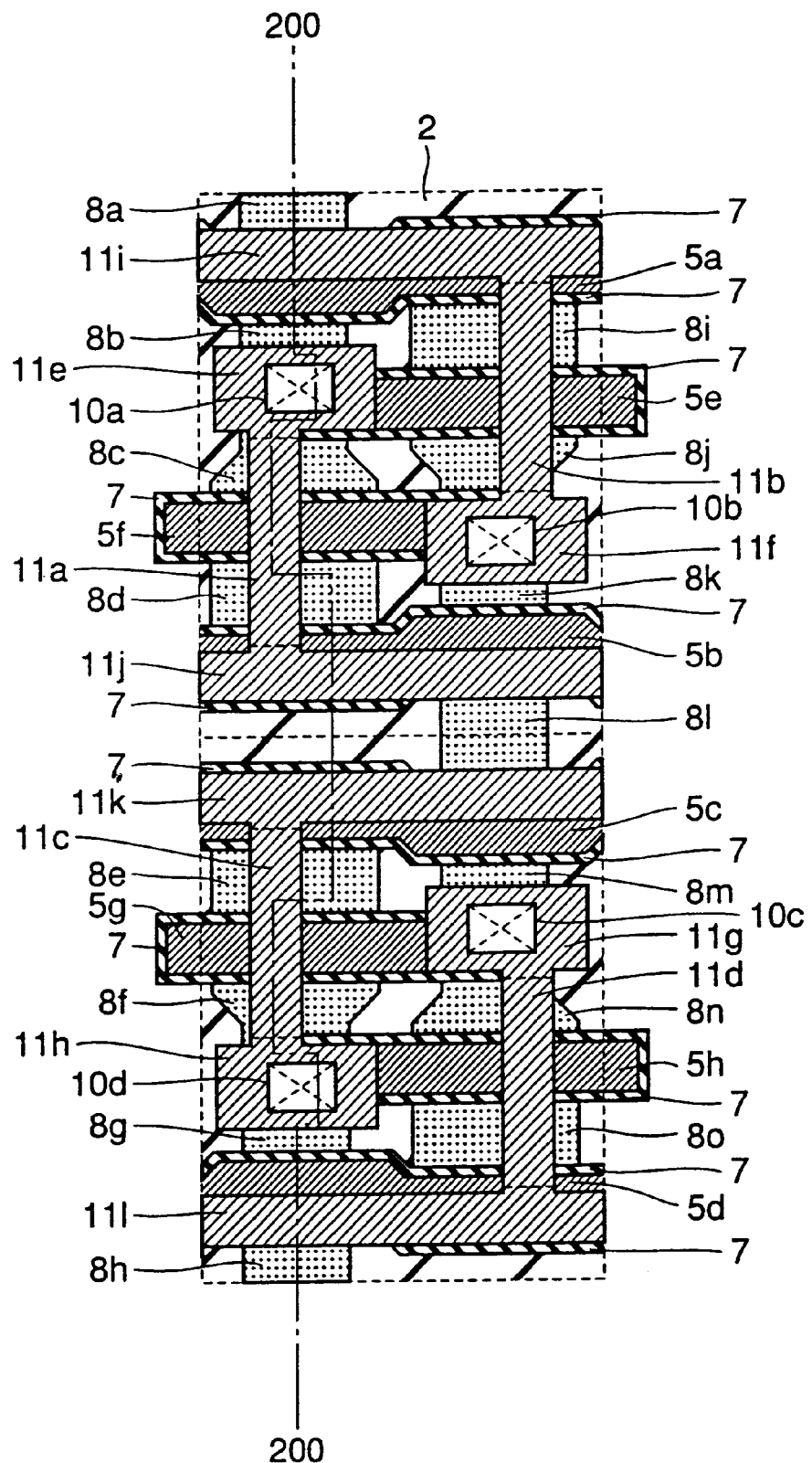
FIG. 24 is a two-dimensional layout for use in illustration of the second step in the manufacture of the memory cells in the SRAM according to the second embodiment shown in FIG. 18.
Figure 25:
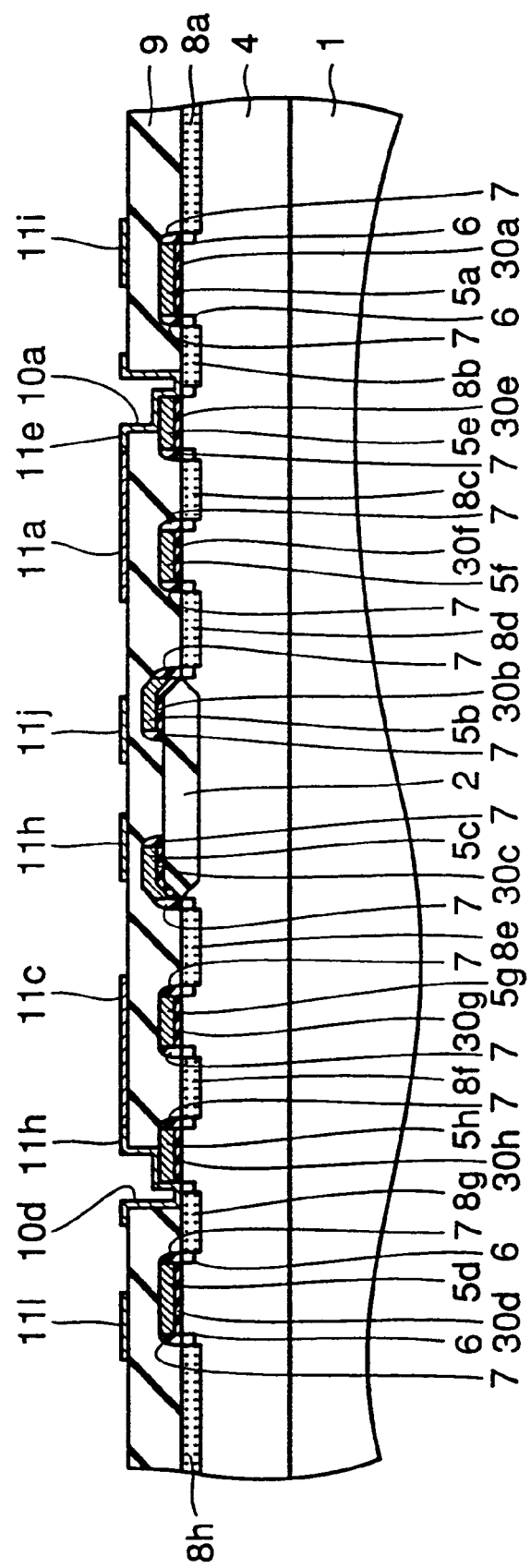
FIG. 25 is a cross sectional view taken along line 200—200 in FIG. 24.
Figure 26:
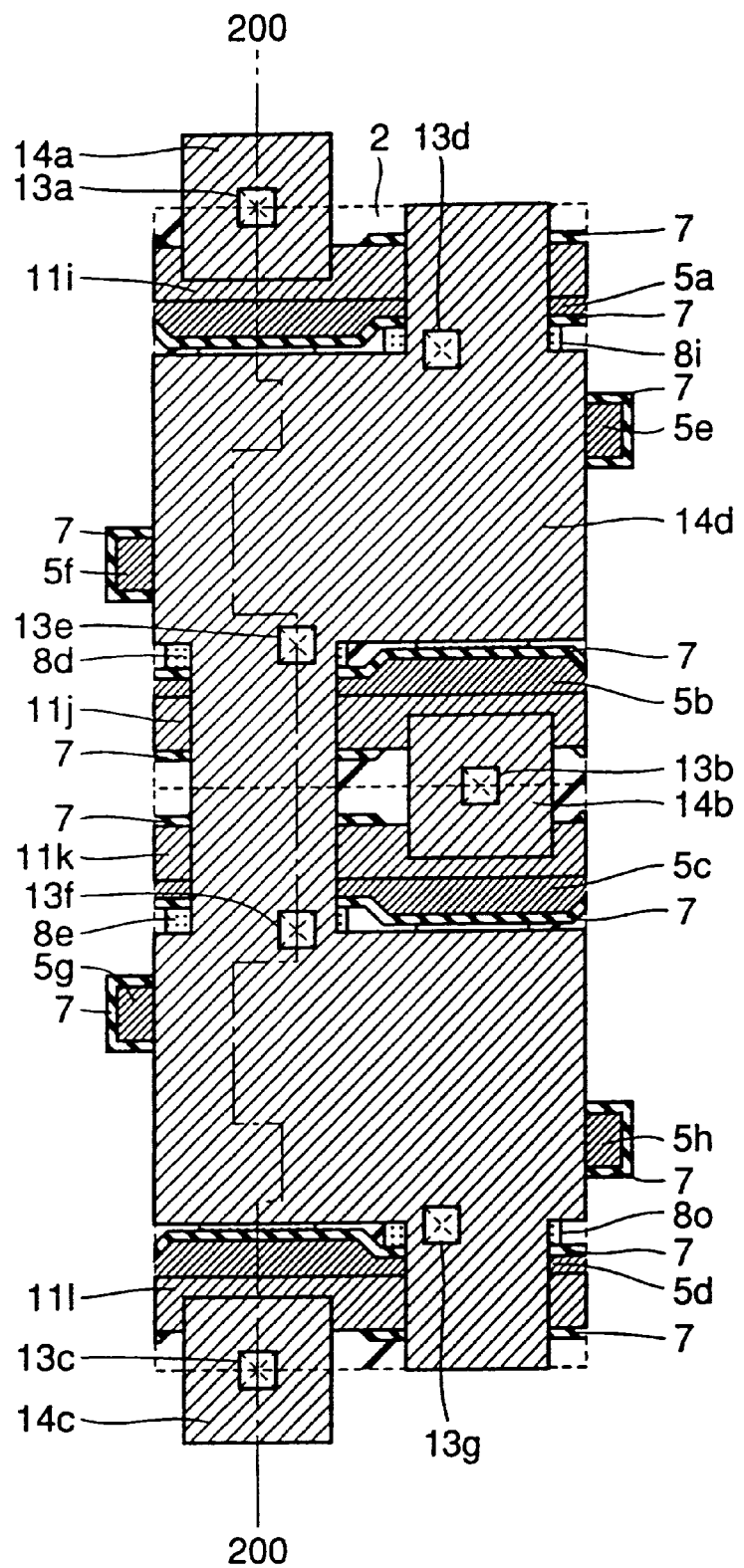
FIG. 26 is a two-dimensional layout for use in illustration of the third step in the manufacture of the memory cells in the SRAM according to the second embodiment shown in FIG. 18.
Figure 27:
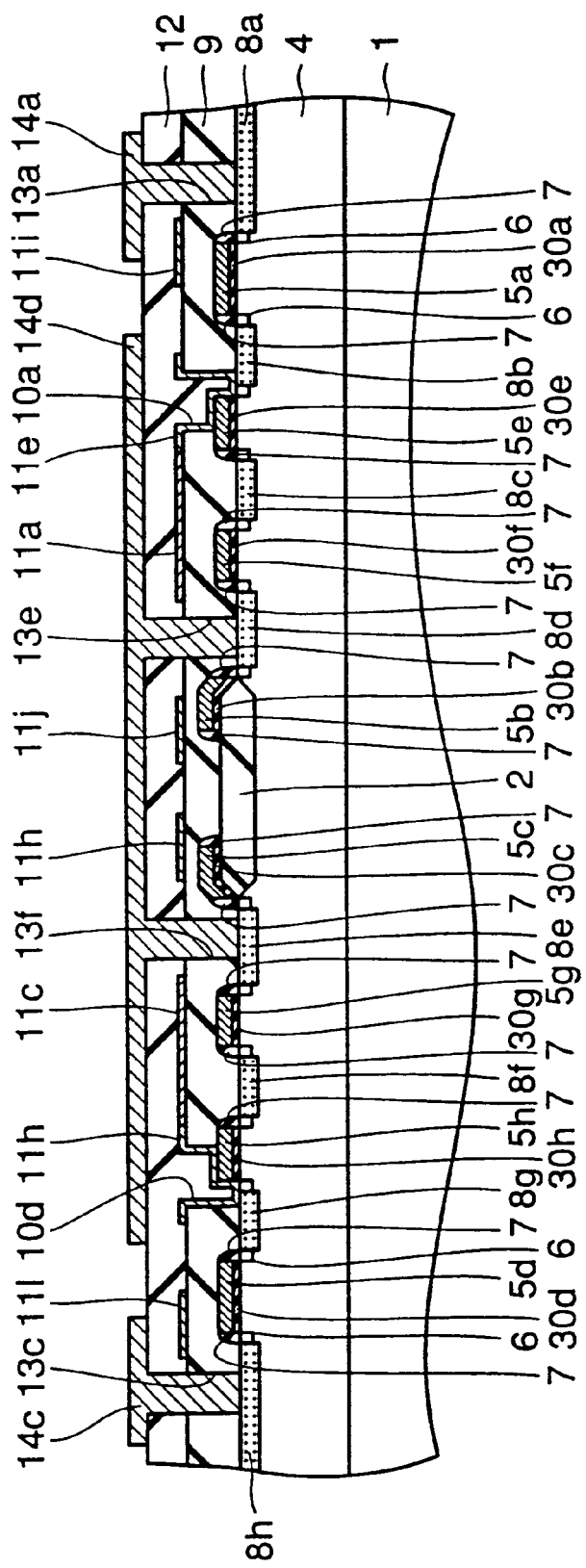
FIG. 27 is a cross sectional view taken along line 200—200 in FIG. 26.
Figure 28:
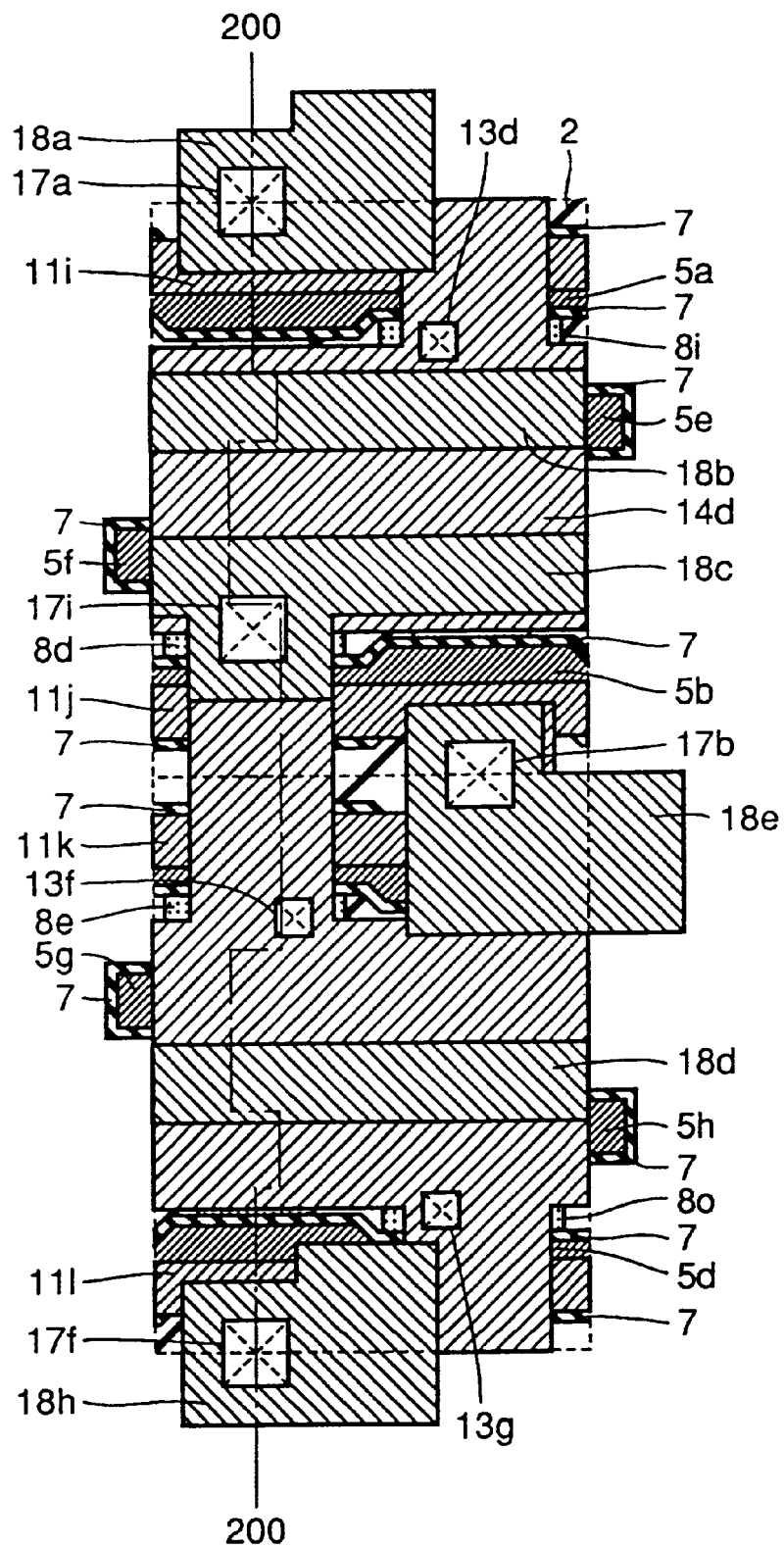
FIG. 28 is a two-dimensional layout for use in illustration of the fourth step in the manufacture of the memory cells in the SRAM according to the second embodiment shown in FIG. 18.
Figure 29:
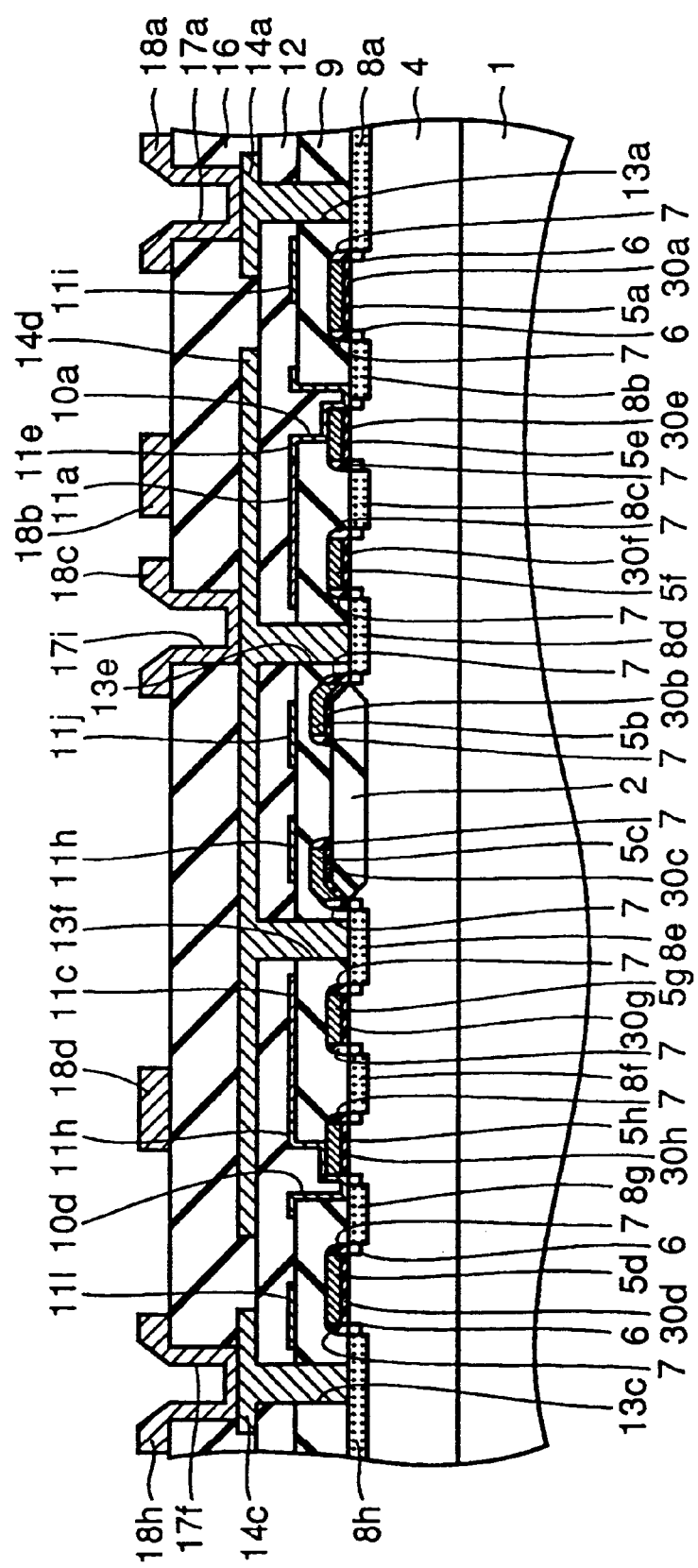
FIG. 29 is a cross sectional view taken along line 200—200 in FIG. 28.
Figure 30:
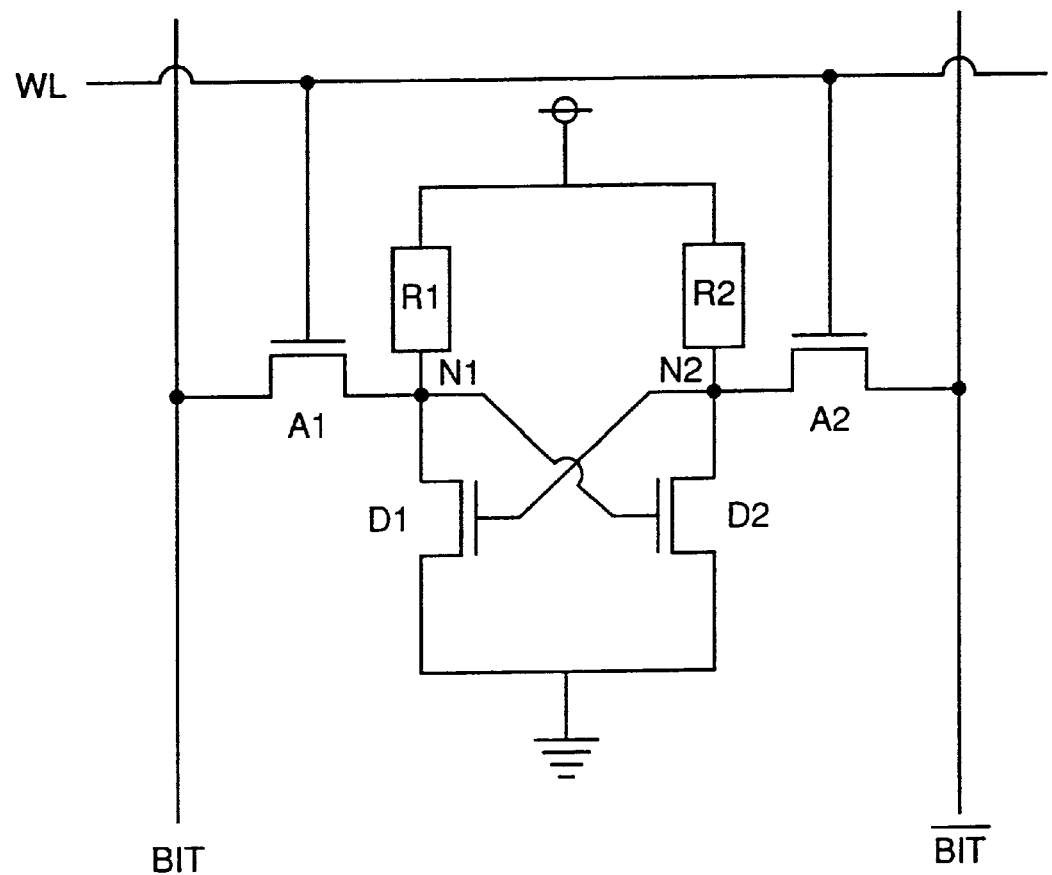
FIG. 30 is an equivalent circuit diagram of a memory cell in a conventional SRAM.
Figure 31:
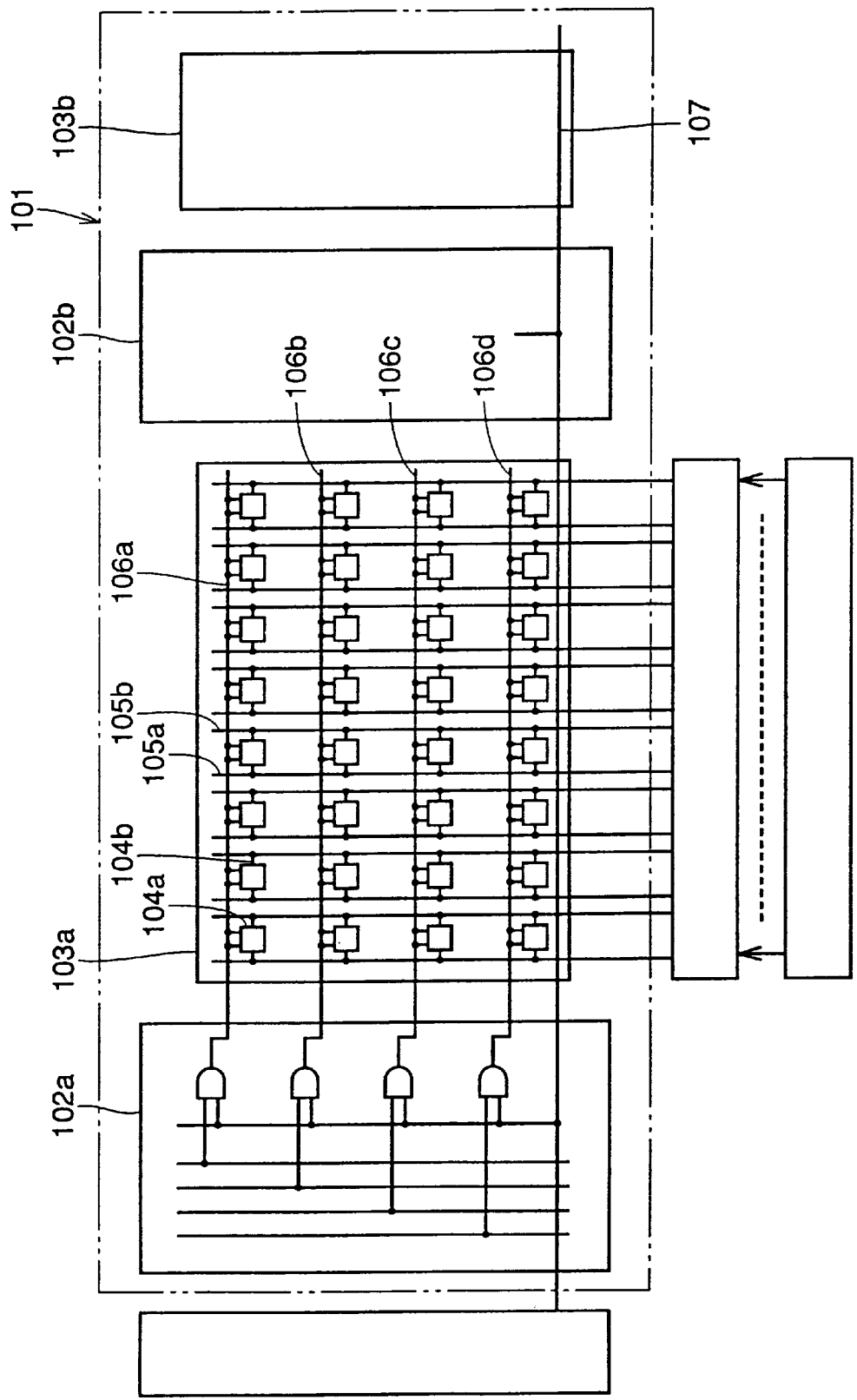
FIG. 31 is a diagram showing the memory array in the conventional SRAM.
Figure 32:
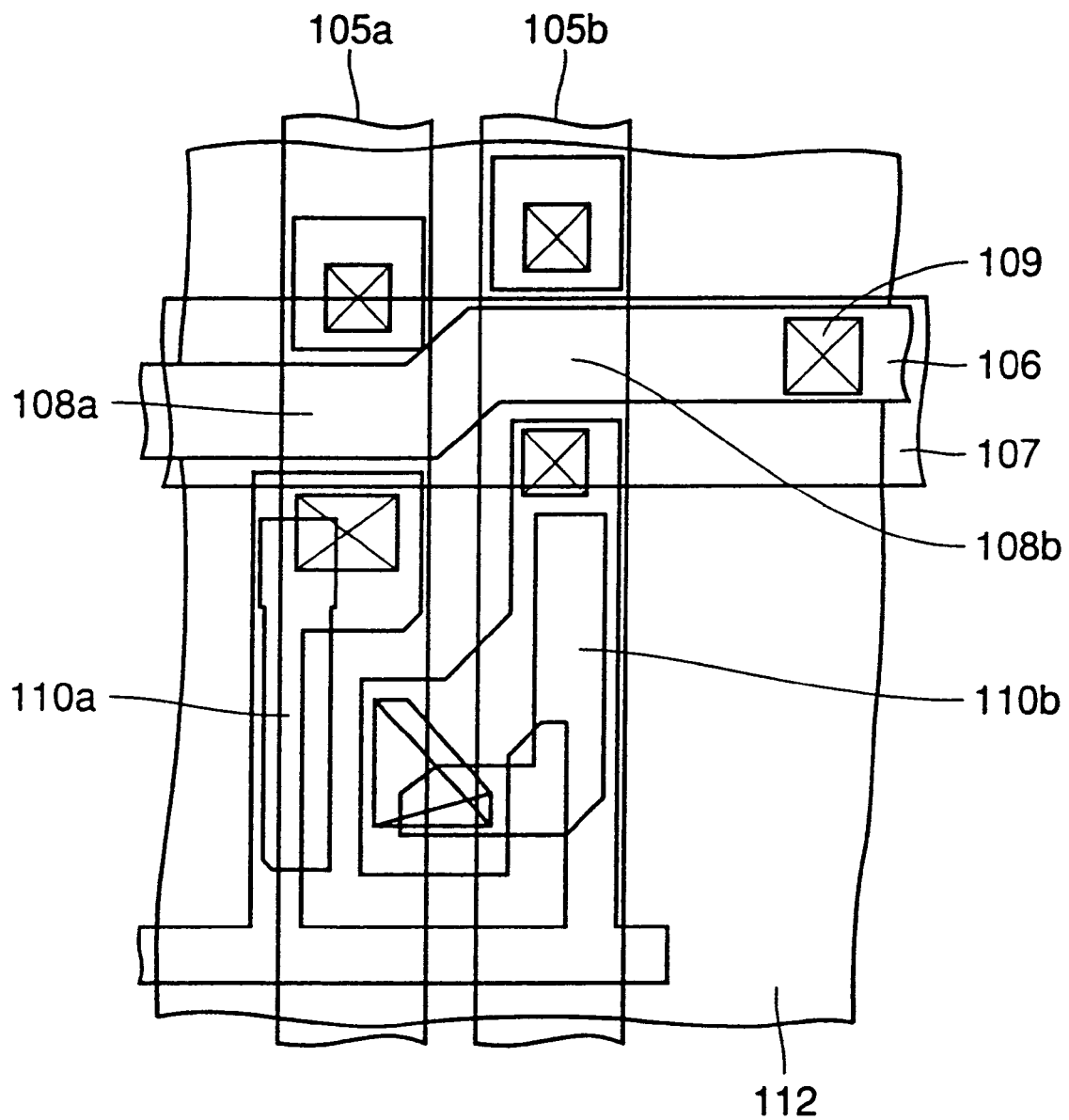
FIG. 32 is a two-dimensional layout of the memory cell in the conventional SRAM.

Referring to FIGS. 18 to 20, the memory cell portion of an SRAM according to a second embodiment of the invention will be now described.

The memory cell according to the second embodiment has substantially the same structure as the memory cell in the SRAM according to the first embodiment. In the memory cell according to the second embodiment, however, shunt word lines 18b and 18e (see FIG. 18) are formed for memory cells on a one-to-one basis. In the memory cell region, contact hole 17i (see FIG. 20) connecting ground line 14d (see FIG. 20) and shunt ground line 18c (see FIG. 20) are formed as a shunt connection region.

Thus, according to the second embodiment, referring to FIG. 20, ground line 14d is electrically connected with shunt ground line 18c, and therefore current passed to ground line 14d may be passed to low resistance shunt ground line 18c of a metal film. As a result, the resistance of ground line 14d may be reduced, which stabilizes the potential of ground line 14d at the ground level, thus permitting the operation of the semiconductor device at lower voltages. Furthermore, contact hole 17i, the connection portion of ground line 14d and shunt ground line 18c is formed in a region positioned on a memory cell, and therefore it is not necessary to secure another connection region for ground line 14d and shunt ground line 18c outside the memory cell. The semiconductor device may be further integrated as a result.

Referring to FIG. 19, according to the second embodiment, since shunt word lines 18b, 18e and shunt ground line 18c are formed in layers different from bit line 28a, they may be provided in directions orthogonal to each other free from limitations in layout.

The manufacturing process as shown in FIGS. 22 to 29 is substantially identical to the manufacturing process of the memory cells in the SRAM according to the first embodiment shown in FIGS. 4 to 17.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device, comprising:
   a first memory cell, said first memory cell being one of a plurality of memory cells arranged in a matrix;
   a first ground line formed on said first memory cell;
   two word lines provided in a single layer on said first memory cell;
   a first low resistance shunt interconnection formed on said first ground line having a first interlayer insulating film therebetween, wherein said first shunt interconnection is one of a plurality of shunt interconnections, each of said plurality of shunt interconnections provided corresponding to at least two of said plurality of memory cells arranged adjacent to each other in a direction substantially orthogonal to the direction in which said first ground line extends, and each of said plurality of shunt interconnections arranged on only one of said at least two corresponding memory cells; and a first shunt connection region formed in a region two-dimensionally overlapping said first memory cell for electrically connecting said first ground line and said first shunt interconnection.

2. The semiconductor device as recited in claim 1, wherein said first shunt interconnection includes at least one of a metal layer and a refractory metal silicide layer.

3. The semiconductor device as recited in claim 1, wherein said first shunt connection region is formed for at least two memory cells provided adjacent to each other in the direction in which said first ground line extends.

4. A semiconductor device as recited in claim 1, further comprising:

a second memory cell provided adjacent to said first memory cell in a direction substantially orthogonal to the direction in which said first ground line extends, and a second ground line formed on said second memory cell to extend substantially in parallel to said first ground line and electrically connecting with said first ground line.

5. A semiconductor device, comprising:

first and second memory cells, each being one of a plurality of memory cells arranged in a matrix;

a ground line formed on one of said first and second memory cells;

two word lines provided in a single layer on said first memory cell;

a first low resistance shunt interconnection formed on said word lines with a first interlayer insulating film therebetween, wherein said first shunt interconnection is one of a plurality of first shunt interconnections, each of said plurality of first shunt interconnections provided corresponding to at least two of said plurality of memory cells arranged adjacent to each other in a direction substantially orthogonal to the direction in which said word line extends;

a second low resistance shunt interconnection formed on said word lines and said ground line with a second interlayer insulating film therebetween, said second shunt interconnection being one of a plurality of second shunt interconnections, each of said plurality of second shunt interconnections provided corresponding to at least two of said plurality of memory cells arranged adjacent to each other in said direction substantially orthogonal to the direction in which said word lines extend, and each of said plurality of second shunt interconnections arranged on only one of said at least two corresponding memory cells;

a first shunt connection region formed in a region two-dimensionally overlapping said first memory cell for electrically connecting said word lines and said first low resistance shunt interconnection; and a second shunt connection region formed in a region two-dimensionally overlapping said first memory cell for electrically connecting said ground line and said second shunt interconnection.

6. The semiconductor device as recited in claim 5, wherein said first shunt interconnection includes at least one of a metal layer and a refractory metal silicide layer.

7. The semiconductor device as recited in claim 5, further comprising a power supply line formed so as not to two-dimensionally overlap said first connection region in a region positioned between said word lines and said first shunt interconnection.

8. The semiconductor device as recited in claim 5, further comprising a ground line formed so as not to two-dimensionally overlap said first connection region in a region positioned between said word lines and said first shunt interconnection.

9. The semiconductor device as recited in claim 5, wherein said first shunt connection region is formed for at least four memory cells provided adjacent to each other in the direction in which said word lines extends.

* * * * *